United States Patent
Lee et al.

(10) Patent No.: US 10,854,845 B2
(45) Date of Patent: Dec. 1, 2020

(54) DISPLAY DEVICE

(71) Applicant: Samsung Display Co., Ltd., Yongin-si (KR)

(72) Inventors: Won Se Lee, Seoul (KR); Won Kyu Kwak, Seongnam-si (KR); Dong Wook Kim, Asan-si (KR); Ae Shin, Seoul (KR); Sang Hun Oh, Cheonan-si (KR); Jang Kyu Yim, Cheonan-si (KR); Jun Ho Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/701,795

(22) Filed: Dec. 3, 2019

(65) Prior Publication Data

US 2020/0106049 A1  Apr. 2, 2020

Related U.S. Application Data

(63) Continuation of application No. 15/622,121, filed on Jun. 14, 2017, now Pat. No. 10,505,145.

(30) Foreign Application Priority Data

Jul. 26, 2016  (KR) ........................ 10-2016-0094799
Mar. 14, 2017  (KR) ........................ 10-2017-0031945

(51) Int. Cl.
*H01L 51/52* (2006.01)
*H01L 27/32* (2006.01)

(52) U.S. Cl.
CPC ........ *H01L 51/5253* (2013.01); *H01L 27/326* (2013.01); *H01L 27/3216* (2013.01); *H01L 27/3239* (2013.01); *H01L 27/3246* (2013.01); *H01L 27/3248* (2013.01); *H01L 27/3258* (2013.01)

(58) Field of Classification Search
None
See application file for complete search history.

(56) References Cited

U.S. PATENT DOCUMENTS 7,279,708 B2  10/2007  Kwak et al.
8,536,580 B2  9/2013  Kang
2005/0077814 A1  4/2005  Koo et al.
(Continued)

FOREIGN PATENT DOCUMENTS

EP  2 731 138  5/2014
GB  2 419 023  4/2006
(Continued)

OTHER PUBLICATIONS

Extended European Search Report corresponding to European Patent Application No. 17182483.2, dated Dec. 15, 2017.

*Primary Examiner* — Telly D Green
*Assistant Examiner* — Lawrence C Tynes, Jr.
(74) *Attorney, Agent, or Firm* — Kile Park Reed & Houtteman PLLC

(57) ABSTRACT

A display device may include a substrate having a first pixel area, a first electrode on the substrate; a passivation layer between the substrate and the first electrode, a second electrode on the first electrode, and an organic emission layer between the first electrode and the second electrode. The first pixel area may include an emission area and a non-emission area surrounded by the emission area.

15 Claims, 24 Drawing Sheets

(56) References Cited

U.S. PATENT DOCUMENTS

| | | | |
|---|---|---|---|
| 2009/0195144 A1* | 8/2009 | Kitabayashi | H01L 27/3246 313/503 |
| 2009/0289963 A1* | 11/2009 | Minami | G09G 3/3233 345/690 |
| 2010/0044690 A1* | 2/2010 | Okutani | H01L 27/3211 257/40 |
| 2012/0280215 A1 | 11/2012 | Choi et al. | |
| 2013/0329288 A1* | 12/2013 | Yim | H01L 51/5281 359/483.01 |
| 2014/0184577 A1 | 7/2014 | Kim et al. | |
| 2014/0306200 A1* | 10/2014 | Jinta | H01L 27/3246 257/40 |
| 2014/0312321 A1 | 10/2014 | Yoo et al. | |
| 2015/0200237 A1 | 7/2015 | Yim et al. | |
| 2015/0340655 A1 | 11/2015 | Lee et al. | |
| 2016/0155979 A1 | 6/2016 | Yim et al. | |
| 2016/0163770 A1* | 6/2016 | Kim | H01L 27/326 257/40 |
| 2017/0162637 A1 | 6/2017 | Choi et al. | |

FOREIGN PATENT DOCUMENTS

| | | |
|---|---|---|
| JP | 2011-23769 | 2/2011 |
| KR | 10-0658758 | 12/2006 |
| KR | 10-2015-0081728 | 7/2015 |

* cited by examiner

DISPLAY DEVICE

CROSS-REFERENCE TO RELATED APPLICATION(S)

This application is a continuation application of U.S. patent application Ser. No. 15/622,121, filed Jun. 14, 2017, the disclosure of which is herein incorporated by reference in its entirety. U.S. patent application Ser. No. 15/622,121 claims priority benefit of Korean Patent Application No. 10-2016-0094799, filed on Jul. 26, 2016, and Korean Patent Application No. 10-2017-0031945, filed on Mar. 14, 2017 in the Korean Intellectual Property Office, the disclosures of which are incorporated herein by reference in its entirety for all purposes.

BACKGROUND

1. Field

The present disclosure relates to a display device, and more particularly, to a display device that may prevent deterioration of an emission characteristic of an organic emission layer.

2. Description of the Related Art

An organic light emitting diode (OLED) display includes two electrodes and an organic emission layer interposed therebetween. Electrons injected from one electrode and holes injected from the other electrode are combined in the organic emission layer to generate excitons. The generated excitons are changed to a ground state from an exited state, releasing energy to emit light.

The OLED display includes a plurality of pixels including an OLED as a self-emissive element, and a plurality of transistors for driving the OLED and at least one capacitor are formed in each pixel. The plurality of transistors generally include a switching transistor and a driving transistor.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides a substrate that includes a first pixel area, a first electrode positioned on the substrate; a passivation layer positioned between the substrate and the first electrode; a second electrode positioned on the first electrode; and an organic emission layer positioned between the first electrode and the second electrode, wherein the first pixel area may include an emission area and a non-emission area surrounded by the emission area.

A distance from an edge of the first pixel area to the non-emission area of the first pixel area may be equal to or less than about 50 μm.

The first electrode and the organic emission layer may be positioned in the emission area of the first pixel area.

The substrate may include a second pixel area and a third pixel area, each of the second pixel area and the third pixel area may include an emission area and a non-emission area surrounded by the emission area, a distance from an edge of the second pixel area to the non-emission area of the second pixel area may be equal to or less than about 50 μm, a distance from an edge of the third pixel area to the non-emission area of the third pixel area may be equal to or less than about 50 μm, and the first electrode and the organic emission layer may be positioned in the emission area of the second pixel area and the emission area of the third pixel area.

The substrate may further include a transmissive area that is adjacent to the first pixel area, the second pixel area, and the third pixel area.

The first electrode and the organic emission layer may not be positioned in the transmissive area.

The second electrode may be positioned in the first pixel area, the second pixel area, the third pixel area, and the transmissive area.

The display device may further include: a buffer layer configured to be positioned on the substrate; and a thin film transistor positioned on the buffer layer and to be connected to the first electrode, wherein the second electrode may contact the buffer layer in the transmissive area.

The display device may further include a buried pattern positioned in the non-emission area of the first pixel area.

The display device may further include a pixel defining layer configured to surround an edge of the first pixel area, wherein the buried pattern may be made of the same material as the pixel defining layer, and may be positioned at the same layer as the pixel defining layer.

The first electrode may be formed as multiple layers including a layer made of a transparent conductive material and a layer made of a reflective metal material.

A ratio of the first non-emission area of the first pixel area to the first pixel area may be equal to or greater than about 5% and equal to or less than about 20%.

The non-emission area of the first pixel area may be formed to have at least one of a quadrangular shape, a circular shape, and a cross shape, in a plan view.

The first pixel may include a plurality of non-emission areas, and a distance between the plurality of non-emission areas adjacent to each other may be equal to or less than about 50 μm.

The display device may further include a thin film transistor connected to the first electrode, wherein the thin film transistor may be positioned in the first pixel area.

The thin film transistor may overlap at least some of the non-emission area of the first pixel area.

The passivation layer may include a first portion having a first height and a second portion having a second height that is higher than the first height.

The second portion of the passivation layer may be positioned at an edge of the first pixel area.

The first electrode may include a step that is formed between the first portion and the second portion of the passivation layer.

The display device may further include a groove configured to be formed in the passivation layer, wherein the groove may be positioned in the non-emission area of the first pixel area.

A width of the groove may be narrower than that of the non-emission area.

The display device may further include a buried pattern positioned in the non-emission area of the first pixel area, wherein the buried pattern may be positioned in the groove.

The display device may further include a pixel defining layer configured to surround an edge of the first pixel area, wherein the buried pattern may be made of the same material as the pixel defining layer, and may be positioned at the same layer as the pixel defining layer.

The display device may further include a groove configured to be formed in the passivation layer, wherein the groove may be positioned to be adjacent to an edge of the first pixel area.

The display device may further include a buried pattern positioned in the groove.

The display device may further include a pixel defining layer integrated with the buried pattern to surround an edge of the first pixel area, wherein the buried pattern may be made of the same material as the pixel defining layer.

The substrate may include the second pixel area, the third pixel area, and a transmissive area that is adjacent to the first pixel area, the second pixel area, and the third pixel area, and each of the second pixel area and the third pixel area may include an emission area and a non-emission area surrounded by the emission area.

The first electrode and the organic emission layer may be not positioned in the transmissive area, and the second electrode may be positioned in the first pixel area, the second pixel area, the third pixel area, and the transmissive area.

The second pixel area may be positioned between the first pixel area and the third pixel area, and a first groove may be provided at a first edge of the transmissive area adjacent to the second pixel area.

A width of the second pixel area may be wider than those of the first pixel area and the third pixel area.

A second groove may be provided at a second edge facing the first edge of the transmissive area.

The first pixel area may be a blue pixel area, the second pixel area may be a green pixel area, and the third pixel area may be a red pixel area.

A width of some of the first pixel area and a width of the second pixel area may be wider than that of the third pixel area.

The first groove may be provided at the first edge of the transmissive area adjacent to some of the first pixel area and to the second pixel area.

A second groove may be provided at the second edge facing the first edge of the transmissive area.

The first pixel area may be a blue pixel area, the second pixel area may be a green pixel area, and the third pixel area may be a red pixel area.

The first pixel area, the second pixel area and the third pixel area may be disposed along a column direction, and the transmissive area may be adjacent to the first pixel area, the second pixel area and the third pixel area in a row direction.

A length from an upper edge to a lower edge of the transmissive area may be shorter than that from an upper edge of the first pixel area to a lower edge of the third pixel area.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
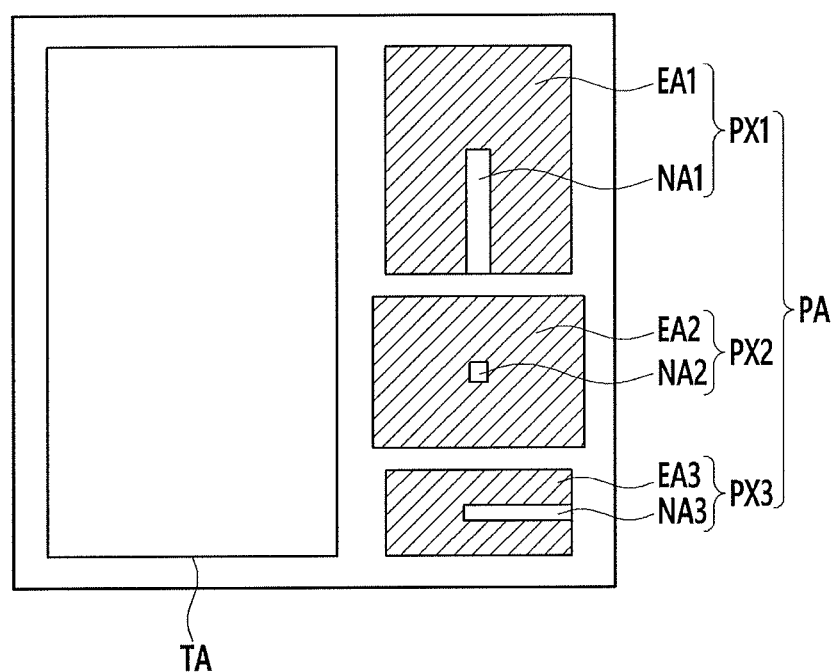
FIG. 1 illustrates a layout view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

To clearly describe embodiments, portions which do not relate to the description are omitted, and like reference numerals designate like elements throughout the specification.

Further, the size and thickness of each component shown in the drawings are arbitrarily shown for better understanding and ease of description, but the present invention is not limited thereto. In the drawings, the thickness of layers, films, panels, regions, etc., are exaggerated for clarity. For better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Figure 2:
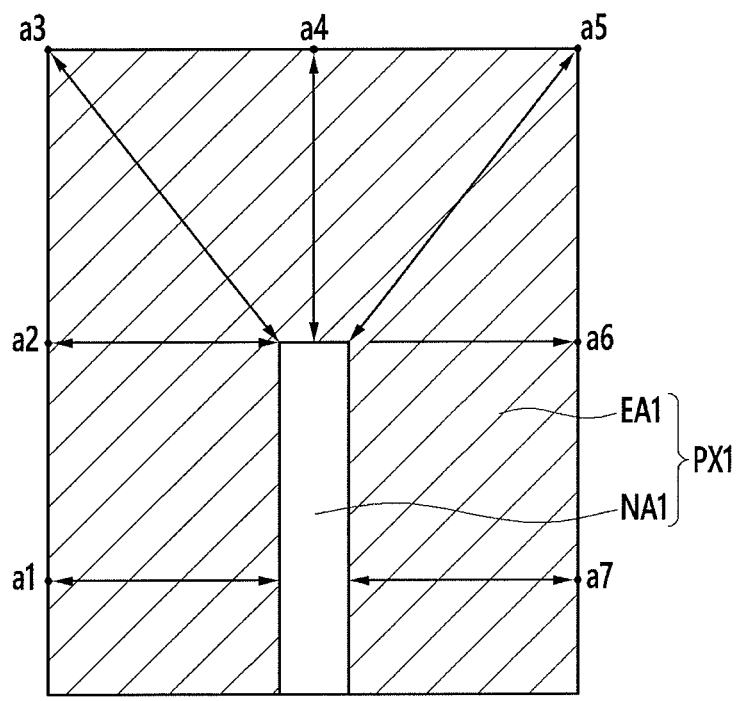
FIG. 2 illustrates a layout view of a first pixel area of a display device according to an exemplary embodiment.
Figure 3:
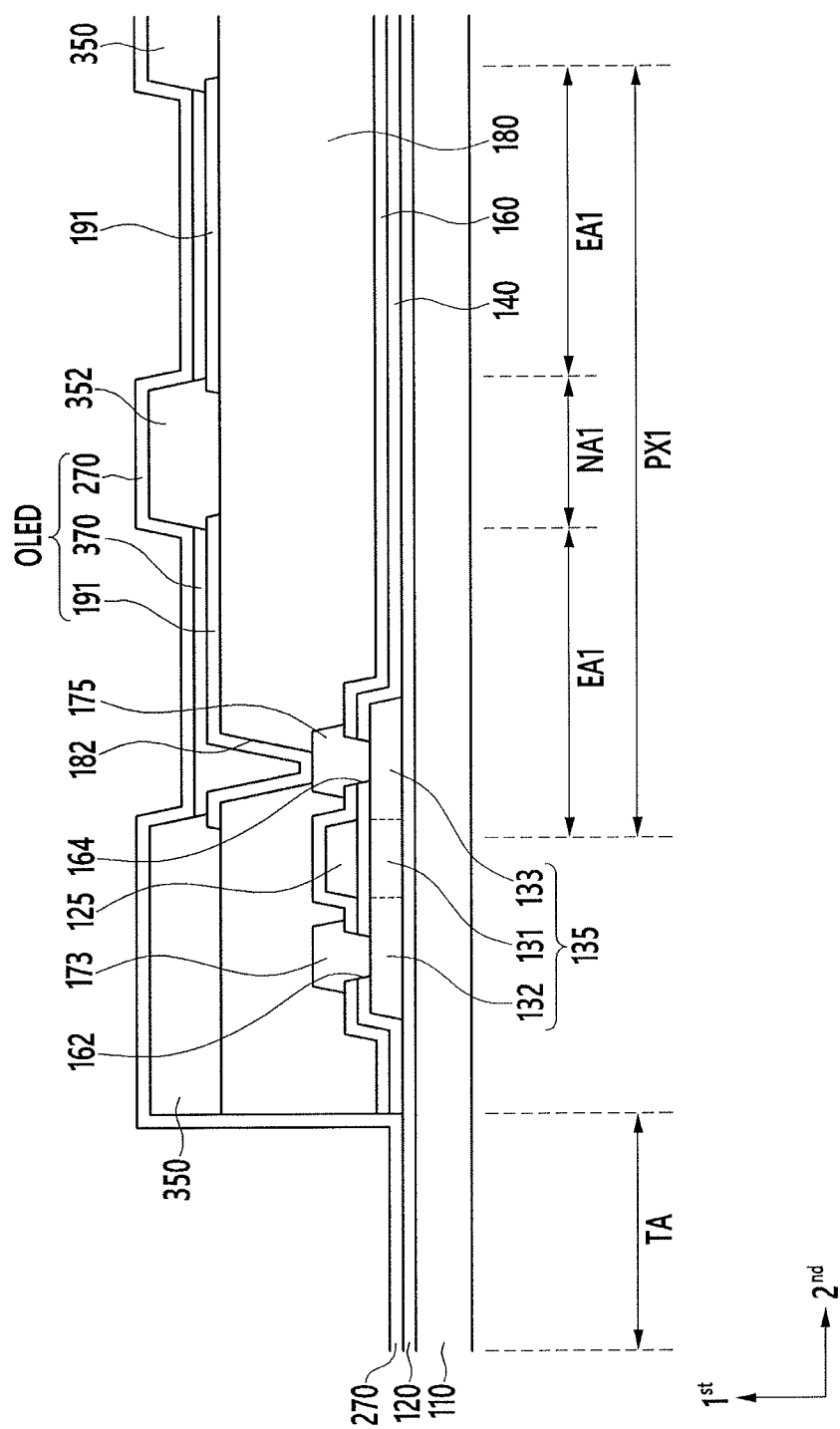
FIG. 3 illustrates a cross-sectional view of a first pixel area of a display device according to an exemplary embodiment.
Figure 4:
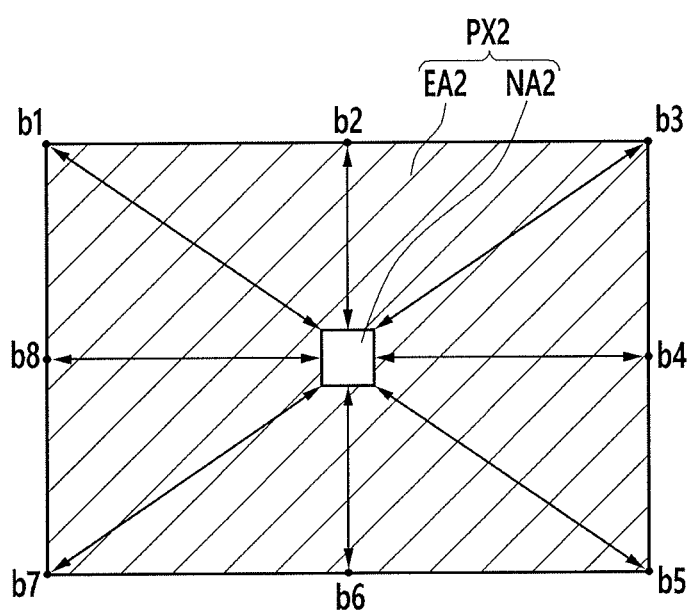
FIG. 4 illustrates a layout view of a second pixel area of a display device according to an exemplary embodiment.
Figure 5:
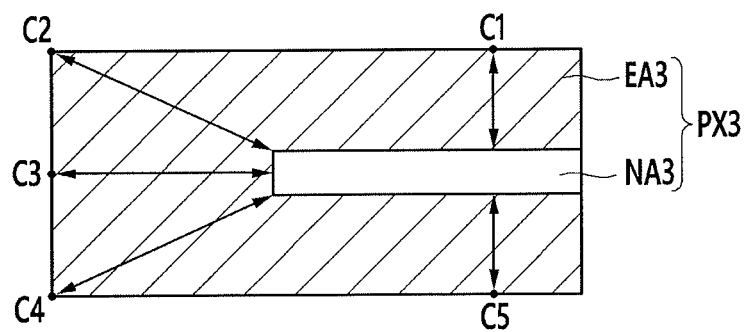
FIG. 5 illustrates a layout view of a third pixel area of a display device according to an exemplary embodiment.

A display device according to an exemplary embodiment will now be described with reference to FIG. 1 to FIG. 5. FIG. 1 illustrates a layout view of a display device according to an exemplary embodiment, FIG. 2 illustrates a layout view of a first pixel area of a display device according to an exemplary embodiment, and FIG. 3 illustrates a cross-sectional view of a first pixel area of a display device according to an exemplary embodiment. FIG. 4 illustrates a layout view of a second pixel area of a display device according to an exemplary embodiment, and FIG. 5 illustrates a layout view of a third pixel area of a display device according to an exemplary embodiment.

As shown in FIG. 1, a display device according to an exemplary embodiment includes a pixel area PA for displaying an image and a transmissive area TA through which light is transmitted. The pixel area PA may include a first pixel area PX1, a second pixel area PX2, and a third pixel area PX3. The first pixel area PX1, the second pixel area PX2, and the third pixel area PX3 may display different colors. For example, the first pixel area PX1 may display a blue color, the second pixel area PX2 may display a green color, and the third pixel area PX3 may display a red color. However, embodiments are not limited thereto, and the first pixel area PX1, the second pixel area PX2, and the third pixel area PX3 may respectively display various colors. Further, a pixel area(s) which may display a different color from those displayed by the first pixel area PX1, the second pixel area PX2, and the third pixel area PX3, may be further included.

The first pixel area PX1, the second pixel area PX2, and the third pixel area PX3 may be formed to have different sizes. In FIG. 1, the first pixel area PX1 is illustrated to be the largest and the third pixel area PX3 is illustrated to be the smallest, but embodiments are not limited thereto. Sizes of the first pixel area PX1, the second pixel area PX2, and the third pixel area PX3 may be variously changed. Alternatively, the sizes of the first pixel area PX1, the second pixel area PX2, and the third pixel area PX3 may be substantially identical.

The display device according to the exemplary embodiment may be used as a display device for a vehicle. In the case of the display device for the vehicle, each pixel area thereof may be generally formed to be larger than that of a display device for a TV, a monitor, or a portable phone.

The first pixel area PX1 includes a first emission area EA1 and a first non-emission area NA1. The first pixel area PX1 and the first non-emission area NA1 may be substantially quadrangular. The first non-emission area NA1 is surrounded by the first emission area EA1. The first emission area EA1 surrounds three of four edges of the first non-emission area NA1. For example, in a plan view, the first emission area EA1 may be formed to surround a left edge, a top edge, and a right edge of the first non-emission area NA1, with a bottom edge thereof being exposed.

The second pixel area PX2 includes a second emission area EA2 and a second non-emission area NA2. The second pixel area PX2 and the second non-emission area NA2 may be substantially quadrangular. The second non-emission area NA2 is surrounded by the second emission area EA2. The second emission area EA2 entirely surrounds four edges of the second non-emission area NA2.

The third pixel area PX3 includes a third emission area EA3 and a third non-emission area NA3. The third pixel area PX3 and the third non-emission area NA3 may be substantially quadrangular. The third non-emission area NA3 is surrounded by the third emission area EA3. The third emission area EA3 surrounds three of four edges of the third non-emission area NA3. For example, in a plan view, the third emission area EA3 may be formed to surround a top edge, a left edge, and a bottom edge of the third non-emission area NA3, with a right edge thereof exposed.

However, the shapes of the first pixel area PX1, the second pixel area PX2, and the third pixel area PX3, the shapes of the first emission area EA1, the second emission area EA2, and the third emission area EA3, and the shapes of the first non-emission area NA1, the second non-emission area NA2, and the third non-emission area NA3, may be variously changed. In FIG. 1, a planar shape of each area is illustrated to be polygonal, but embodiments are not limited thereto, and each area may be formed to have a shape including a curved line such as a circle, an oval, and the like. Further, in the first pixel area PX1, the second pixel area PX2, and the third pixel area PX3, the respective emission areas EA1, EA2, and EA3 and the respective non-emission areas NA1, NA2, and NA3 may be variously disposed.

The transmissive area TA is an area through which external light transmits. By the transmissive area TA, the display device according to the exemplary embodiment may be a transparent display device. In FIG. 1, one transmissive area TA is positioned to be adjacent to the first pixel area PX1, the second pixel area PX2, and the third pixel area PX3. However, embodiments are not limited thereto, and three separate transmissive areas may be positioned to be respectively adjacent to the first pixel area PX1, the second pixel area PX2, and the third pixel area PX3. Alternatively, one transmissive area may be positioned to be adjacent to three or more pixel areas.

A ratio of the transmissive area TA to the total of the pixel area PA, i.e., a sum of the first to third pixel areas, and the transmissive area TA is equal to or greater than about 20% and equal to or less than about 70%. A ratio of the first non-emission area NA1 to the first pixel area PX1 is equal to or greater than about 5% and equal to or less than about 20%. A ratio of the second non-emission area NA2 to the second pixel area PX2 is equal to or greater than about 5% and equal to or less than about 20%. A ratio of the third non-emission area NA3 to the third pixel area PX3 is equal to or less than 5% and equal to or less than about 20%.

As shown in FIG. 2, in the first pixel area PX1, the first emission area EA1 surrounds the first non-emission area NA1. In this case, a distance from a point a1 at a lower portion of the left edge of the first pixel area PX1 to the first non-emission area NA1 may be equal to or less than about 50 μm. Herein, the distance refers to the shortest distance, and the same meaning is applied to the following. A distance from a point a2 at a middle portion of the left edge of the first pixel area PX1 to the first non-emission area NA1 may be equal to or less than about 50 μm. A distance from a vertex a3 at which the left and top edges of the first pixel area PX1 meet the first non-emission area NA1 may be equal to or less than about 50 μm. A distance from a point a4 at a middle portion of the top edge of the first pixel area PX1 to the first non-emission area NA1 may be equal to or less than about 50 μm. A distance from a vertex a5 at which the top and right edges of the first pixel area PX1 meet the first non-emission area NA1 may be equal to or less than about 50 μm. A distance from a point a6 at a middle portion of the right edge of the first pixel area PX1 to the first non-emission area NA1 may be equal to or less than about 50 μm. A distance from a point a7 at a lower portion of the right edge of the first pixel area PX1 to the first non-emission area NA1 may be equal to or less than about 50 μm. That is, the distances from all edges of the first pixel area PX1 to the first non-emission area NA1 may be equal to or less than about 50 μm.

As shown in FIG. 3, the display device according to the exemplary embodiment includes a substrate 110, a first electrode 191 positioned on the substrate 110, a passivation layer 180 positioned between the substrate 110 and the first electrode 191, a second electrode 270 positioned on the first electrode 191, and an organic emission layer 370 positioned between the first electrode 191 and the second electrode 270.

The substrate 110 may be an insulating substrate made of glass, quartz, ceramic, plastic, etc., or a metal substrate made of stainless steel and the like. The substrate 110 may be flexible, stretchable, foldable, bendable, and/or rollable. Since the substrate 110 may be flexible, stretchable, foldable, bendable, and/or rollable, the display device may also be flexible, stretchable, foldable, bendable, and/or rollable.

The substrate 110 includes the first pixel area PX1 and the transmissive area TA. The first pixel area PX1 includes the first emission area EA1 and the first non-emission area NA1.

A buffer layer 120 may be positioned on the substrate 110. The buffer layer 120 may be formed as a single layer of a silicon nitride (SiNx) or a dual layer of a silicon nitride (SiNx) and a silicon oxide (SiOx). The buffer layer 120 serves to flatten a surface of the substrate 110 while preventing permeation of unwanted materials, e.g., impurities or moisture. The buffer layer 120 may be omitted if necessary. The entire buffer layer 120 may be in the first pixel area PX1 and the transmissive area TA. The buffer layer 120 may entirely cover a top surface of the substrate 110.

A semiconductor 135 is on the buffer layer 120. The semiconductor 135 may be made of a polycrystalline semiconductor material or an oxide semiconductor material. In addition, the semiconductor 135 may include a channel region 131, in which no impurities are doped, and contact doping regions 132 and 133 at opposite sides of the channel region 131 in which impurities are doped. The contact doping regions 132 and 133 include a source region 132 and a drain region 133. In this case, the doped impurities may vary depending on a kind of the thin film transistor.

A gate insulating layer 140 may be on the semiconductor 135. The gate insulating layer 140 may be made of an inorganic insulating material including a silicon nitride (SiNx) or a silicon oxide (SiOx).

A gate electrode 125 may be on the gate insulating layer 140. The gate electrode 125 may overlap at least some of the semiconductor 135, e.g., the channel region 131 thereof, in a light emitting direction, e.g., a first direction).

An interlayer insulating layer 160 may be on the gate electrode 125 and the gate insulating layer 140. The interlayer insulating layer 160 may be made of an inorganic insulating material or an organic insulating material.

Contact holes 162 and 164 overlapping at least some of the semiconductor 135 in the first direction may be formed in the gate insulating layer 140 and in the interlayer insulating layer 160. Particularly, the contact holes 162 and 164 may expose the contact doping regions 132 and 133 of the semiconductor 135, respectively.

A source electrode 173 and a drain electrode 175 may be on the interlayer insulating layer 160. The source electrode 173 and the drain electrode 175 are respectively connected to the source region 132 and the drain region 133 of the semiconductor 135 through the contact holes 162 and 164.

As such, the semiconductor 135, the gate electrode 125, the source electrode 173, and the drain electrode 175 form one thin film transistor. A structure of the thin film transistor is not limited to the aforementioned example, and may be modified to a variety of disclosed structures that can be easily implemented by those skilled in the art. The organic light emitting diode display may include a switching transistor and a driving transistor, and the aforementioned thin film transistor may be the driving transistor. Although not illustrated, a switching thin film transistor may be provided.

The passivation layer 180 may be on the thin film transistor and the interlayer insulating layer 160. The passivation layer 180 serves to remove and flatten steps, thereby increasing luminous efficiency of the OLED to be formed thereon. A contact hole 182 overlapping at least some of the drain electrode 175 in the first direction, i.e., to expose the drain electrode 175, may be formed in the passivation layer 180. The passivation layer 180 may be formed of a polyacrylate resin, an epoxy resin, a phenolic resin, a polyamide resin, a polyimide resin, an unsaturated polyester resin, a polyphenylene resin, a polyphenylene sulfide resin, and benzocyclobutene (BCB).

The first electrode 191 is positioned on the passivation layer 180. The first electrode 191 is positioned in the first emission area EA1 of the first pixel area PX1. Most of the first electrode 191 is not positioned in the first non-emission area NA1 of the first pixel area PX1.

The first electrode 191 may be made of a transparent conductive material such as indium tin oxide (ITO), indium zinc oxide (IZO), zinc oxide (ZnO), indium oxide ($In_2O_3$), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The first electrode 191 is electrically connected to the drain electrode 175 of the thin film transistor via the contact hole 182 formed in the passivation layer 180, and may serve as the anode of the OLED.

Although not illustrated, the first electrode 191 may include first and second transparent electrodes including a transparent conductive material, and a semi-transmissive layer positioned between the first and second transparent electrodes to form a microcavity together with the second electrode 270. That is, the first electrode 191 may be formed as a multilayer including a layer made of the transparent conductive material and a layer made of a reflective metal material.

A pixel defining layer 350 may be on the passivation layer 180 and on a first edge portion of the first electrode 191. The pixel defining layer 350 may surround the edges of the first pixel area PX1. The pixel defining layer 350 may include a resin, e.g., a polyacrylate resin and a polyimide resin, or a silica-based inorganic material.

A buried pattern 352 may be on the passivation layer 180 and on a second edge portion, opposite the first edge portion, of the first electrode 191. The buried pattern 352 may be in the first non-emission area NA1 of the first pixel area PX1. The buried pattern 352 may be made of the same material as the pixel defining layer 350, and may be at the same layer as the pixel defining layer 350. Since the buried pattern 352 covers a lateral surface of the edge of the first electrode 191, the buried pattern 352 may prevent the first electrode 191 from being exposed to the outside and being corroded, thus preventing a dark spot from occurring. Even though the first electrode 191 and the organic emission layer 370 are positioned at the edge of the first non-emission area NA1, light may be blocked by the buried pattern 352. Thus, a minimal overlap in the light emitting direction, e.g., first direction, may be used, as long as the lateral edge of the second edge portion of the first electrode 191 is covered. For example, an overlapping width of the buried pattern 352 and the first electrode 191 may be equal to or greater than about 0 µm and may be equal to or less than about 5 µm. For example, the buried pattern 352 and the first electrode 191 may overlap each other by about 3 µm.

The organic emission layer 370 may be on the first electrode 191. The organic emission layer 370 may include at least one of an emission layer, a hole-injection layer (HIL), a hole-transporting layer (HTL), an electron-transporting layer (ETL), and an electron-injection layer (EIL). The organic emission layer 370 may be in the first emission area EA1 of the first pixel area PX1. The organic emission layer 370 may also be positioned in the first non-emission area NA1 of the first pixel area PX1.

The organic emission layer 370 may include one of a red organic emission layer for emitting red light, a green organic emission layer for emitting green light, and a blue organic emission layer for emitting blue light. For example, the blue organic emission layer may be in the first emission area EA1 of the first pixel area PX1, the green organic emission layer may be in the second emission area EA2 of the second pixel area PX2, and the red organic emission layer may be in the third emission area EA3 of the third pixel area PX3. The red organic emission layer, the green organic emission layer, and the blue organic emission layer are respectively positioned at different pixels to implement a color image by a combination thereof.

Alternatively, the organic emission layer 370 may have a structure in which the red organic emission layer, the green organic emission layer, and the blue organic emission layer are respectively stacked on corresponding pixels. In this case, a color image may be implemented by forming a red filter, a green filter, or a blue filter for each pixel. In another example, by forming a white organic emission layer for emitting white light at each pixel and by forming a red filter, a green filter, and a blue filter for each pixel, it is possible to implement a color image. When the color image is implemented by using the white organic emission layer and the color filter, a deposition mask for respectively depositing the red organic emission layer, the green organic emission layer, and the blue organic emission layer on each corresponding pixel, that is, on the red pixel, on the green pixel, and the blue pixel, is not required.

The white organic emission layer described in another example may be formed as a single organic emission layer, and may be formed as a plurality of organic emission layers stacked so that the white light may be emitted. For example, a structure for emitting white light by combining at least one yellow organic emission layer with at least one blue organic emission layer, a structure for emitting white light by combining at least one cyan organic emission layer with at least one red organic emission layer, and a structure for emitting white light by combining at least one magenta organic emission layer with at least one green organic emission layer may be included.

The second electrode 270 may be on the organic emission layer 370, the pixel defining layer 350, and the buried pattern 352. The second electrode 270 may be on the first pixel area PX1 and the transmissive area TA, and may be between the first pixel area PX1 and the transmissive area TA.

The second electrode 270 may be made of a transparent conductive material such as indium tin oxide (ITO), indium zinc oxide (IZO), zinc oxide (ZnO), indium oxide (In$_2$O$_3$), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The second electrode 270 may serve as a cathode of the OLED. The first electrode 191, the organic emission layer 370, and the second electrode 270 form the OLED.

The thin film transistor, the gate insulating layer 140, the interlayer insulating layer 160, the passivation layer 180, the first electrode 191, and the organic emission layer 370, which are described above, are in the first pixel area PX1, but not in the transmissive area TA. The buffer layer 120 may be directly on the transmissive area TA of the substrate 110, and the second electrode 270 may be directly on the buffer layer 120. Accordingly, the second electrode 270 may contact, e.g., directly contact, the buffer layer 120 in the transmissive area TA. As such, since other layers excluding the buffer layer 120 and the second electrode 270 are not in the transmissive area TA of the substrate 110, transmittance of the transmissive area TA may be improved. However, embodiments are not limited thereto, and some layers other than the buffer layer 120 and the second electrode 270 may be in the transmissive area TA.

The passivation layer 180 is between the substrate 110 and the first electrode 191, and the organic emission layer 370 is on the first electrode 191. The passivation layer 180 is made of an organic material, and a baking process is performed during a process in which the passivation layer 180 is formed. In the baking process, gas may be generated while the organic material is cured. Before the gas is entirely discharged, the first electrode 191 may be formed on the passivation layer 180 such that the passivation layer 180 is shielded by the first electrode 191, preventing gas from being discharged. The gas remaining in the passivation layer 180 may move to the edge of the first electrode 191 to be discharged, and the organic emission layer 370 positioned on the first electrode 191 may be affected by the gas. Since the organic emission layer 370 is vulnerable to moisture permeation, an emission characteristic thereof may deteriorate, thus an emission area thereof may be reduced.

In the present exemplary embodiment, the first pixel area PX1 includes the first emission area EA1 and the first non-emission area NA1, and the first electrode 191 may not be positioned in the first non-emission area NA1. However, embodiments are not limited thereto, and the organic emission layer 370 may be both in the first emission area EA1 and partially in the first non-emission area NA1. As described above, although the first electrode 191 and the organic emission layer 370 are in the first non-emission area NA1, since the first electrode 191 is patterned such that a portion of the passivation layer 180 is exposed and light is blocked by the buried pattern 352, the first non-emission area NA1 does not emit light. Further, the buried pattern 352 may directly contact the exposed portion of the passivation layer 180.

By setting the distance from all of the edges of the first pixel area PX1 to the first non-emission area NA1 to be equal to or less than about 50 µm, the first electrode 191 in the first emission area EA1 may not continuously shield the passivation layer 180. In the present exemplary embodiment, by forming the first non-emission area NA1 in which most of first electrode 191 is not positioned in the first pixel area PX1, gas remaining in the passivation layer 180 may be sufficiently discharged through the first non-emission area NA1. Accordingly, deterioration of the emission characteristic of the organic emission layer 370 may be reduced or prevented.

As shown in FIG. 4, in the second pixel area PX2, the second emission area EA2 surrounds the second non-emission area NA2. A distance from a vertex b1 at which the left and top edges of the second pixel area PX2 meet the second non-emission area NA2 may be equal to or less than about 50 µm. A distance from a point b2 at a middle portion of the top edge of the second pixel area PX2 to the second non-emission area NA2 may be equal to or less than about 50 µm. A distance from a vertex b3 at which the top and right edges of the second pixel area PX2 meet the second non-emission area NA2 may be equal to or less than about 50 µm. A distance from a point b4 at a middle portion of the right edge of the second pixel area PX2 to the second non-emission area NA2 may be equal to or less than about 50 µm. A distance from a vertex b5 at which the right and bottom edges of the second pixel area PX2 meet the second non-emission area NA2 may be equal to or less than about 50 µm. A distance from a point b6 at a middle portion of the bottom edge of the second pixel area PX2 to the second non-emission area NA2 may be equal to or less than about 50 µm. A distance from a vertex b7 at which the bottom and left edges of the second pixel area PX2 meet the second non-emission area NA2 may be equal to or less than about 50 µm. A distance from point b8 at a middle portion of the left edge of the second pixel area PX2 to the second non-emission area NA2 may be equal to or less than about 50 µm. That is, the distances from all edges of the second pixel area PX2 to the second non-emission area NA2 may be equal to or less than about 50 µm.

Although not illustrated, similar to the first pixel area PX1, the first electrode and the organic emission layer may be positioned in the second emission area EA2 of the second pixel area PX2. The first electrode is mostly not in the second non-emission area NA2, but may be at the edges of the second non-emission area NA2. The organic emission layer may be positioned in the second non-emission area NA2. By setting the distance from all of the edges of the second pixel area PX2 to the second non-emission area NA2 to be equal to or less than about 50 µm, it is possible to prevent the first electrode positioned in the second emission area EA2 from continuously shielding a wide area of the passivation layer. In the present exemplary embodiment, by forming the second non-emission area NA2 in which the first electrode is not mostly positioned in the second pixel area PX2, gas remaining in the passivation layer may be sufficiently discharged through the second non-emission area NA2. Accordingly, deterioration of the emission characteristic of the organic emission layer may be reduced or prevented.

As shown in FIG. 5, in the third pixel area PX3, the third emission area EA3 surrounds the third non-emission area NA3. A distance from a point c1 at the top edge of the third pixel area PX3 to the third non-emission area NA3 may be equal to or less than about 50 µm. A distance from a point c2 at which the top and left edges of the third pixel area PX3 meet to the third non-emission area NA3 may be equal to or less than about 50 µm. A distance from a point c3 at a middle portion of the left edge of the third pixel area PX3 to the third non-emission area NA3 may be equal to or less than about 50 µm. A distance from a point c4 at which the left and bottom edges of the third pixel area PX3 meet the third non-emission area NA3 may be equal to or less than about 50 µm. A distance from a point c5 at the bottom edge of the third pixel area PX3 to the third non-emission area NA3 may be equal to or less than about 50 µm. That is, the distances from all edges of the third pixel area PX3 to the third non-emission area NA3 may be equal to or less than about 50 µm.

Although not illustrated, similar to the first pixel area PX1, the first electrode and the organic emission layer are positioned in the third emission area EA3 of the third pixel area PX3. The first electrode is mostly not in the third non-emission area NA3, but may be at the edges of the third non-emission area NA3. The organic emission layer may be in the third non-emission area NA3. By setting the distance from all of the edges of the third pixel area PX3 to the third non-emission area NA3 to be equal to or less than about 50 µm, the first electrode in the third emission area EA3 may not continuously shield a wide area of the passivation layer 180. In particular, a portion of the passivation layer 180 may be exposed by the first electrode 191 to allow gas generated therein to be discharged. In the present exemplary embodiment, by forming the third non-emission area NA3 in which the first electrode is mostly not in the third pixel area PX3, gas remaining in the passivation layer may be sufficiently discharged through the third non-emission area NA3. Accordingly, deterioration of emission characteristic of the organic emission layer may be reduced or prevented.

Hereinafter, a display device according to an exemplary embodiment will be described with reference to FIG. 6 to FIG. 9.

The display device according to the exemplary embodiment shown in FIG. 6 to FIG. 9 includes many portions that are the same as in the display device according to the exemplary embodiment shown in FIG. 1 to FIG. 5, the description thereof will not be repeated. In the present exemplary embodiment, emission areas and non-emission areas in first to third pixel areas are different from those of the previous exemplary embodiments, and will now be described in detail.

Figure 6:
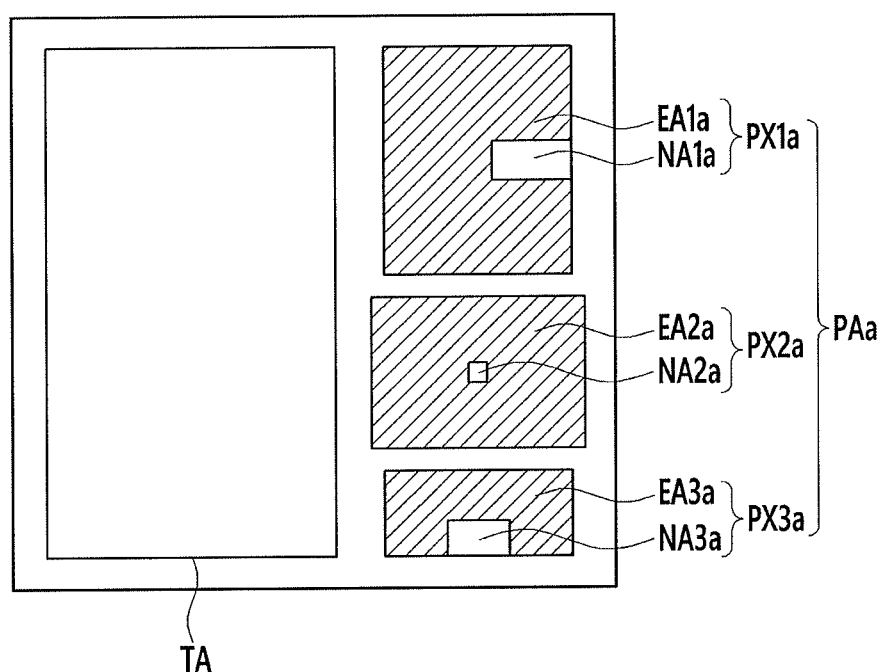
FIG. 6 illustrates a layout view of a display device according to an exemplary embodiment.
Figure 7:
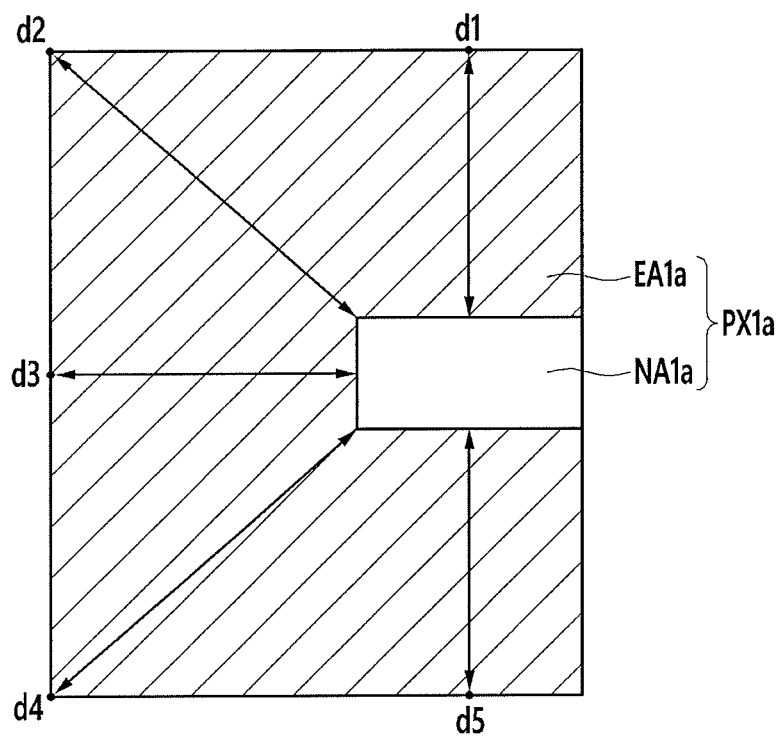
FIG. 7 illustrates a layout view of a first pixel area of a display device according to an exemplary embodiment.

FIG. 6 illustrates a layout view of a display device according to an exemplary embodiment. FIG. 7 illustrates a layout view of a first pixel area of a display device according to an exemplary embodiment, FIG. 8 illustrates a layout view of a second pixel area of a display device according to an exemplary embodiment, and FIG. 9 illustrates a layout view of a third pixel area of a display device according to an exemplary embodiment.

As shown in FIG. 6, the display device according to the exemplary embodiment includes a pixel area PAa and the transmissive area TA. The pixel area PAa may include a first pixel area PX1a, a second pixel area PX2a, and a third pixel area PX3a. The first pixel area PX1a, the second pixel area PX2a, and the third pixel area PX3a may display different colors, and may be formed to have different sizes.

As shown in FIG. 7, the first pixel area PX1a includes a first emission area EA1a and a first non-emission area NA1a surrounded by the first emission area EA1a. Distances from a plurality of points (d1, d2, d3, d4, and d5) positioned at the edges of the first pixel area PX1a to the first non-emission area NA1a may be equal to or less than about 50 µm. In this case, the distance means the shortest distance, and the same meaning is applied to the following. The distances from all the edges of the first pixel area PX1a to the first non-emission area NA1a may be equal to or less than about 50 µm.

Figure 8:
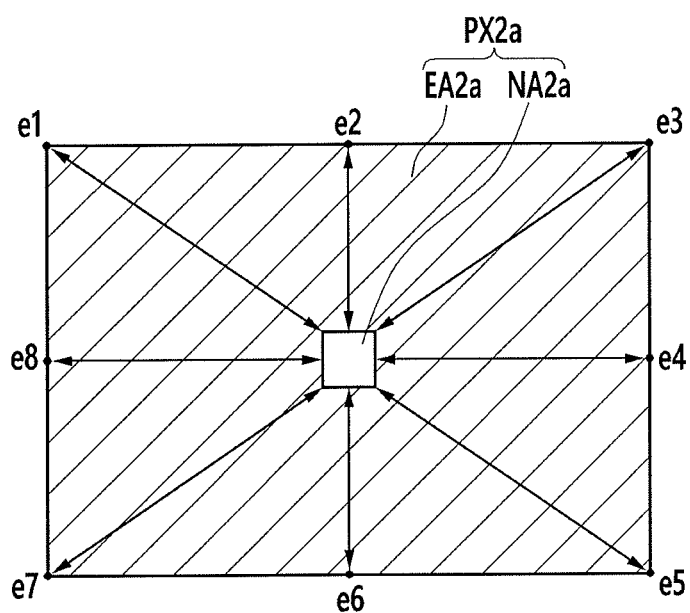
FIG. 8 illustrates a layout view of a second pixel area of a display device according to an exemplary embodiment.
Figure 9:
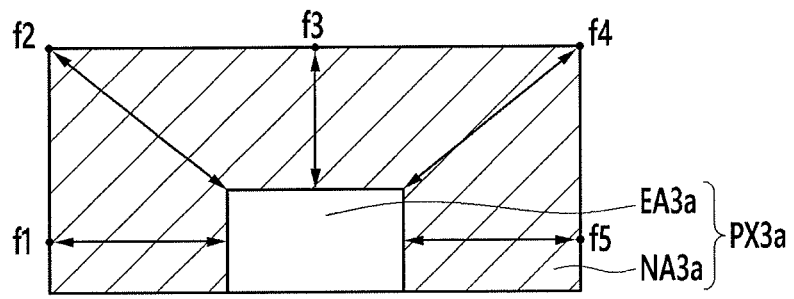
FIG. 9 illustrates a layout view of a third pixel area of a display device according to an exemplary embodiment.

As shown in FIG. 8, the second pixel area PX2a includes a second emission area EA2a and a second non-emission area NA2 surrounded by the second emission area EA2a. Distances from a plurality of points (e1, e2, e3, e4, e5, e6, e7, and e8) at the edges of the second pixel area PX2a to the second non-emission area NA2a may be equal to or less than about 50 μm. In this case, the distances from all the edges of the second pixel area PX2a to the second non-emission area NA2 may be equal to or less than about 50 μm.

As shown in FIG. 9, the third pixel area PX3a includes a third emission area EA3a and a third non-emission area NA3a surrounded by the third emission area EA3a. Distances from a plurality of points (f1, f2, f3, f4, and f5) at the edges of the third pixel area PX3a to the third non-emission area NA3a may be equal to or less than about 50 μm. In this case, the distances from all the edges of the third pixel area PX3a to the third non-emission area NA3a may be equal to or less than about 50 μm.

A display device according to an exemplary embodiment will now be described with reference to FIG. 10 to FIG. 13.

The display device according to the exemplary embodiment shown in FIG. 10 to FIG. 13 includes many portions that are the same as in the display device according to the exemplary embodiment shown in FIG. 1 to FIG. 5, so description thereof will not be repeated. In the present exemplary embodiment, a plurality of non-emission areas are positioned in a single pixel area, which is different from the previous exemplary embodiment, and will now be described in detail.

Figure 10:
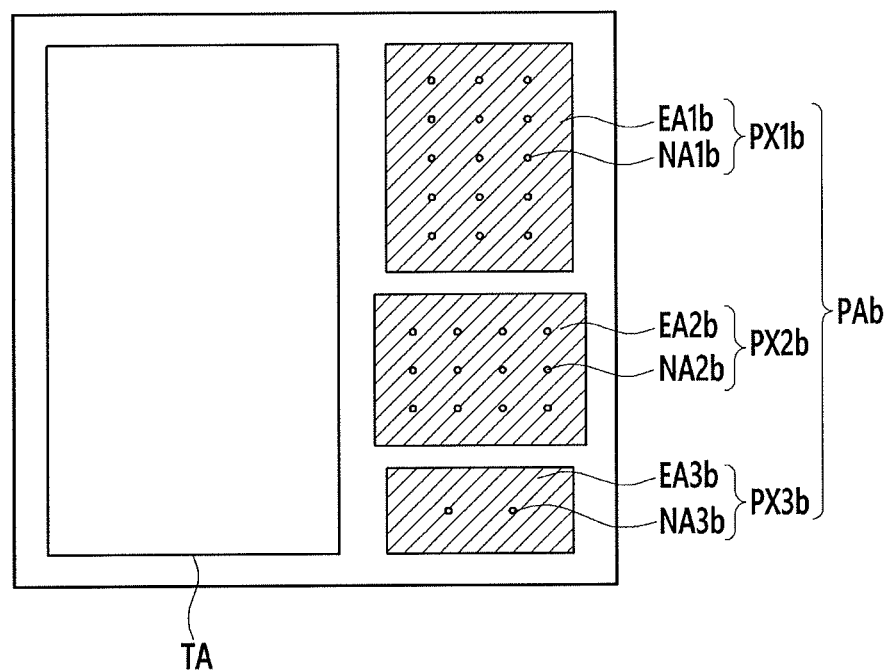
FIG. 10 illustrates a layout view of a display device according to an exemplary embodiment.
Figure 11:
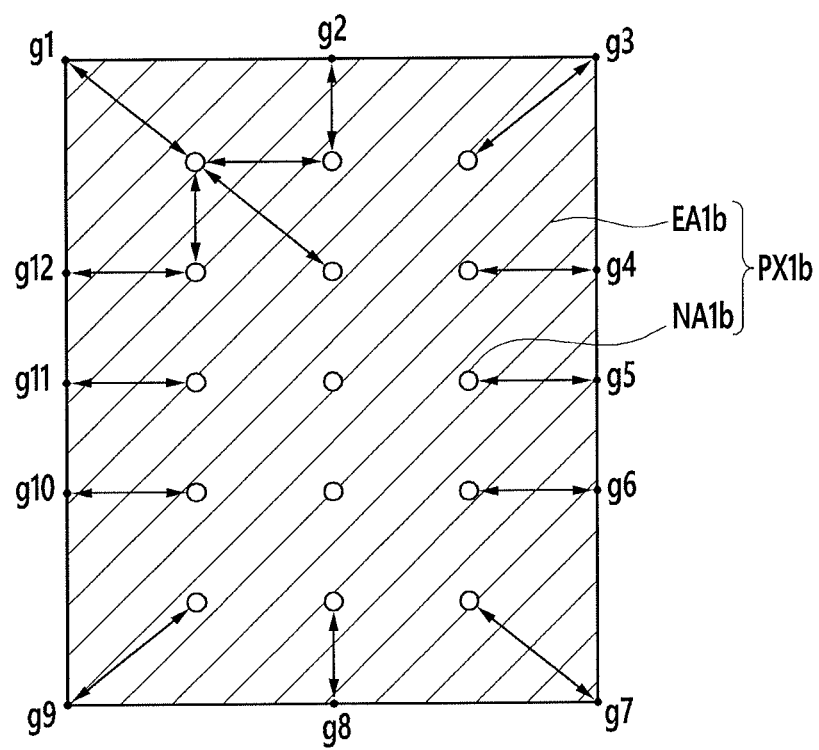
FIG. 11 illustrates a layout view of a first pixel area of a display device according to an exemplary embodiment.
Figure 12:
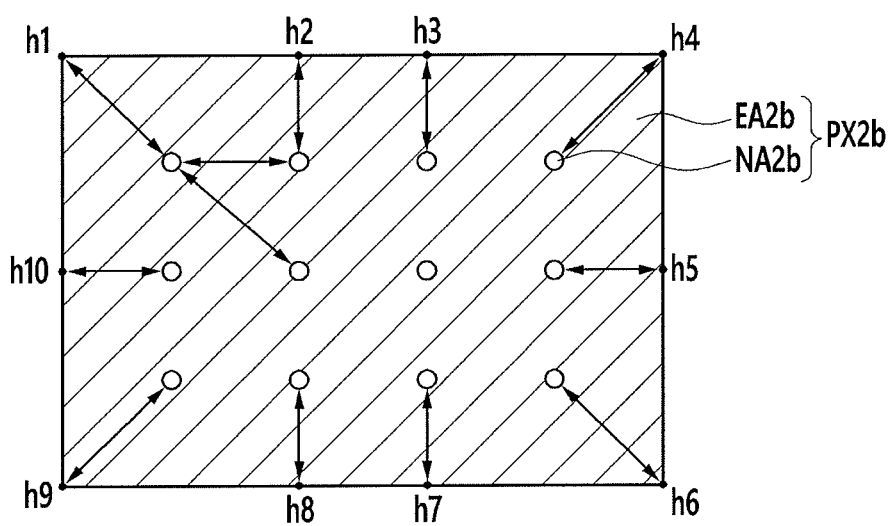
FIG. 12 illustrates a layout view of a second pixel area of a display device according to an exemplary embodiment.
Figure 13:
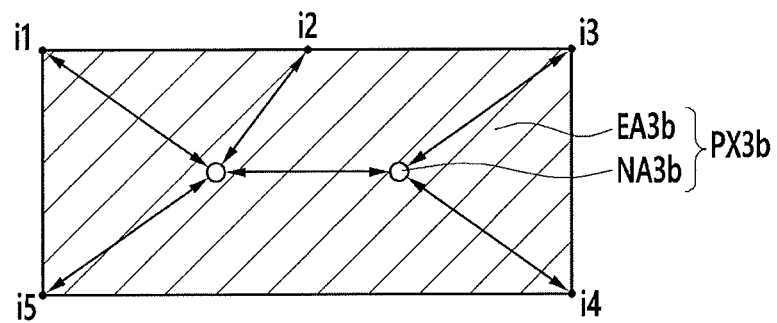
FIG. 13 illustrates a layout view of a third pixel area of a display device according to an exemplary embodiment.

FIG. 10 illustrates a layout view of a display device according to an exemplary embodiment. FIG. 11 illustrates a layout view of a first pixel area of a display device according to an exemplary embodiment, FIG. 12 illustrates a layout view of a second pixel area of a display device according to an exemplary embodiment, and FIG. 13 illustrates a layout view of a third pixel area of a display device according to an exemplary embodiment.

As shown in FIG. 10, the display device according to the exemplary embodiment includes a pixel area PAb and the transmissive area TA. The pixel area PAb may include a first pixel area PX1b, a second pixel area PX2b, and a third pixel area PX3b. The first pixel area PX1b, the second pixel area PX2b, and the third pixel area PX3b may display different colors, and may be formed to have different sizes.

As shown in FIG. 11, the first pixel area PX1b includes a first emission area EA1b and a plurality of first non-emission areas NA1b surrounded by the first emission area EA1b. Although it is illustrated that the plurality of first non-emission areas NA1b respectively have a circular shape, embodiments are not limited thereto, and the first non-emission areas NA1b may be variously modified and may be different from one another.

Distances from a plurality of points (g1, g2, g3, g4, g5, g6, g7, g8, g9, g10, g11, and g12) at the edges of the first pixel area PX1b to the third non-emission area NA1b may be equal to or less than about 50 μm. The distances from all the edges of the first pixel area PX1b to the first non-emission area NA1b may be equal to or less than about 50 μm.

In addition, a distance between adjacent first non-emission areas NA1b may be equal to or less than about 50 μm. For example, the plurality of first non-emission areas NAb1 may be disposed in a matrix form, and a distance between the first non-emission area NA1b in a first row and a first column and the first non-emission area NA1b in a first row and a second column may be equal to or less than about 50 μm. In addition, a distance between the first non-emission area NA1b in the first row and the first column and the first non-emission area NA1b in a second row and the first column may be equal to or less than about 50 μm. Further, a distance between the first non-emission area NA1b in the first row and the first column and the first non-emission area NA1b in the second row and the second column may be equal to or less than about 50 μm.

As shown in FIG. 12, the second pixel area PX2b includes a second emission area EA2b and a plurality of second non-emission areas NA2b surrounded by the second emission area EA2b. Distances from a plurality of points (h1, h2, h3, h4, h5, h6, h7, h8, h9, and h10) positioned at edges of the plurality of second pixel areas PX2b to the second non-emission area NA2b may be equal to or less than about 50 μm. The distances from all the edges of the second pixel area PX2b to the second non-emission area NA2b may be equal to or less than about 50 μm. In addition, a distance between adjacent second non-emission areas NA2b may be equal to or less than about 50 μm.

As shown in FIG. 13, the third pixel area PX3b includes a third emission area EA3b and a plurality of third non-emission areas NA3b surrounded by the third emission area EA3b. Distances from a plurality of points (i1, i2, i3, i4, and i5) at edges of the plurality of third pixel areas PX3b to the third non-emission area NA3b may be equal to or less than about 50 μm. Distances from all the edges of the third pixel area PX3b to the third non-emission area NA3b may be equal to or less than about 50 μm. In addition, a distance between adjacent third non-emission areas NA3b adjacent to each other may be equal to or less than about 50 μm.

Hereinafter, a display device according to an exemplary embodiment will be described with reference to FIG. 14. The display device according to the exemplary embodiment shown in FIG. 14 includes many portions that are the same as in the display device according to the exemplary embodiment shown in FIG. 1 to FIG. 5, such that a description thereof will not be repeated. In the present exemplary embodiment, shapes of the emission area and the non-emission area in the first to third pixel areas are different from those of the previous exemplary embodiment, and will now be described in detail.

Figure 14:
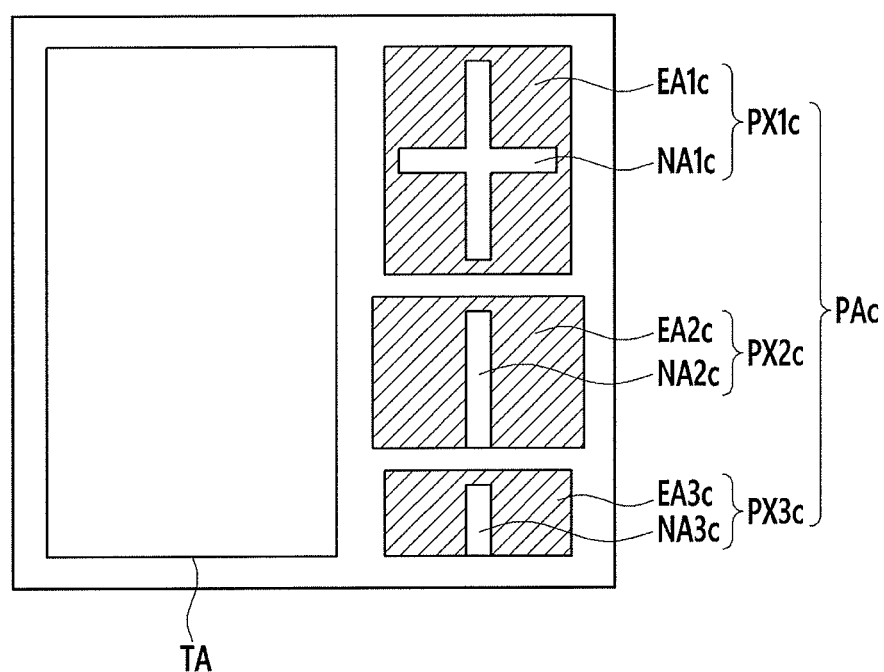
FIG. 14 illustrates a layout view of a display device according to an exemplary embodiment.

FIG. 14 illustrates a layout view of a display device according to an exemplary embodiment. As shown in FIG. 14, the display device according to the exemplary embodiment includes a pixel area PAc and the transmissive area TA. The pixel area PAc may include a first pixel area PX1c, a second pixel area PX2c, and a third pixel area PX3c. The first pixel area PX1c, the second pixel area PX2c, and the third pixel area PX3c may display different colors, and may be formed to have different sizes.

The first pixel area PX1 includes a first emission area EA1c and a first non-emission area NA1c, which is surrounded by the first emission area EA1c. The first non-emission area NA1c is formed to have a cross shape in a plan view. The distances from all the edges of the first pixel area PX1c to the first non-emission area NA1c may be equal to or less than about 50 μm.

The second pixel area PX2c includes a second emission area EA2c and a second non-emission area NA2c, which is surrounded by the second emission area EA2. It is illustrated that the second non-emission area NA2c is formed to have a quadrangular shape in a plan view, but the present exemplary embodiment is not limited thereto, and the second non-emission area NA2c may be formed to have a cross shape in a plan view. The distances from all the edges of the second pixel area PX2c to the second non-emission area NA2c may be equal to or less than about 50 μm.

The third pixel area PX3c includes a third emission area EA3c and the third non-emission area NA3c surrounded by the third emission area EA3. It is illustrated that the third non-emission area NA3c has a quadrangular shape in a plan view, but the present exemplary embodiment is not limited thereto, and the third non-emission area NA3c may be formed to have, e.g., a cross shape in a plan view. The distances from all the edges of the third pixel area PX3c to the third non-emission area NA3c may be equal to or less than about 50 μm.

Hereinafter, a display device according to an exemplary embodiment will be described with reference to FIG. 15. The display device according to the exemplary embodiment shown in FIG. 15 includes many portions that are the same as in the display device according to the exemplary embodiment shown in FIG. 14, such that a description thereof will not be repeated. In the present exemplary embodiment, shapes of the emission area and the non-emission area in the first pixel area are different from those of the previous exemplary embodiment, and will now be described in detail.

Figure 15:
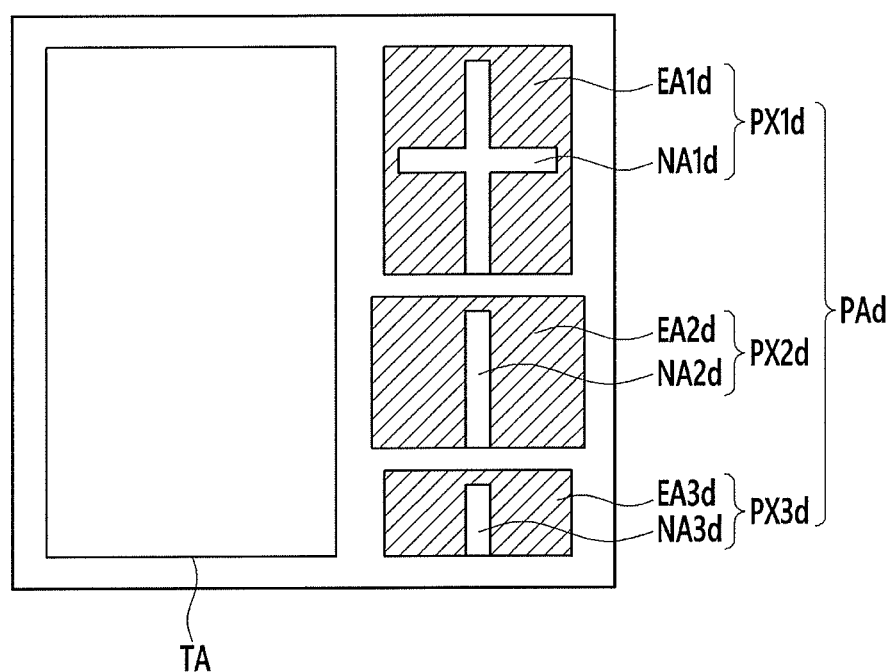
FIG. 15 illustrates a layout view of a display device according to an exemplary embodiment.

FIG. 15 illustrates a layout view of a display device according to an exemplary embodiment. As shown in FIG. 15, the display device according to the exemplary embodiment includes a pixel area PAd and the transmissive area TA. The pixel area PAd includes a first pixel area PX1d having a first emission area EA1d and a first non-emission area NA1d, and the first non-emission area NA1 is formed to have a cross shape in a plan view. The pixel area Pad also includes the second pixel area PX2c and the third pixel area PX3c of FIG. 14.

In the first emission area EA1c of the previous exemplary embodiment, the middle portion of the bottom edge thereof is not cut in a plan view, while in the first emission area EA1d of the present exemplary embodiment, the middle portion of the bottom edge thereof is cut in a plan view. That is, at the middle portion of the bottom edge of the first pixel area PX1d, the first emission area EA1d is separated by the first non-emission area NA1d. At the left edge, the top edge, and the right edge of the first pixel area PX1d, the first emission area EA1d is not separated.

Accordingly, in the first pixel area PX1d, the first electrode 191 may not be separated at the left edge, the top edge, and the right edge of the first pixel area PX1, and may be separated at the middle portion of the bottom edge thereof.

A display device according to an exemplary embodiment will now be described with reference to FIG. 16. The display device according to the exemplary embodiment shown in FIG. 16 includes many portions that are the same as in the display device according to the exemplary embodiment shown in FIG. 15, such that a description thereof will not be repeated. In the present exemplary embodiment, shapes of the emission area and the non-emission area in the first pixel area are different from those of the previous exemplary embodiment, and will now be described in detail.

Figure 16:
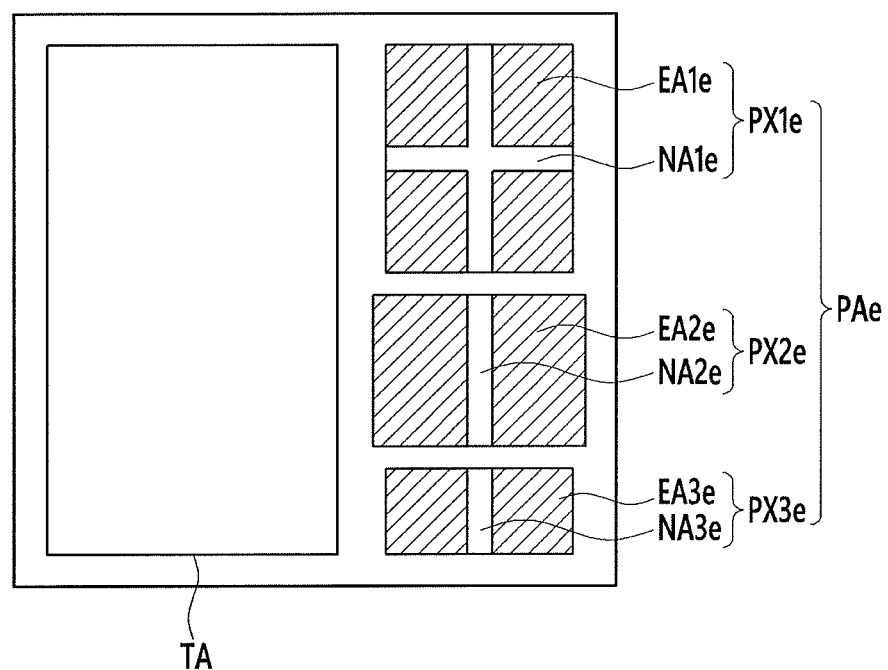
FIG. 16 illustrates a layout view of a display device according to an exemplary embodiment.

FIG. 16 illustrates a layout view of a display device according to an exemplary embodiment. As shown in FIG. 16, the display device according to the exemplary embodiment includes a pixel area PAe and the transmissive area TA. The pixel area PAe may include a first pixel area PX1e, a second pixel area PX2e, and a third pixel area PX3e.

The first pixel area PX1e includes a first emission area EA1e and a first non-emission area NA1e, and the first non-emission area NA1 is formed to have a cross shape in a plan view. At the left edge, the top edge, and the right edge of the first pixel area PX1d of the previous exemplary embodiment, the first emission area EA1d is not separated, while at the left edge, the top edge, and the right edge of the first pixel area PX1e of the present exemplary embodiment, the first emission area EA1e is separated. That is, at the middle portions of the left, top, right, and bottom edges of the first pixel area PX1e, the first emission area EA1e is separated by the first non-emission area NA1e.

Accordingly, in the first pixel area PX1e, the first electrode 191 may be separated at the middle portions of the left, top, right, and bottom edges of the first pixel area PX1e. In this case, the first electrode is separated by four portions, and the four portions may be connected to the drain electrode through different contact holes.

In a like manner, a second emission area EA2e may be separated at the top and bottom edges of the second pixel area PX2e. That is, at the middle portions of the top and bottom edges of the second pixel area PX2e, the second emission area EA2e is separated by a second non-emission area NA2e.

In addition, a third emission area EA3e is separated at the top and bottom edges of the third pixel area PX3e. That is, at the middle portions of the top and bottom edges of the third pixel area PX3e, the third emission area EA3e is separated by a third non-emission area NA3e.

Hereinafter, a display device according to an exemplary embodiment will be described with reference to FIG. 17. The display device according to the exemplary embodiment shown in FIG. 17 includes many portions that are the same as in the display device according to the exemplary embodiment shown in FIG. 1 to FIG. 5, which will not be described. In the present exemplary embodiment, a thin film transistor is positioned in the pixel area, which is different from the previous exemplary embodiment, and will now be described in detail.

Figure 17:
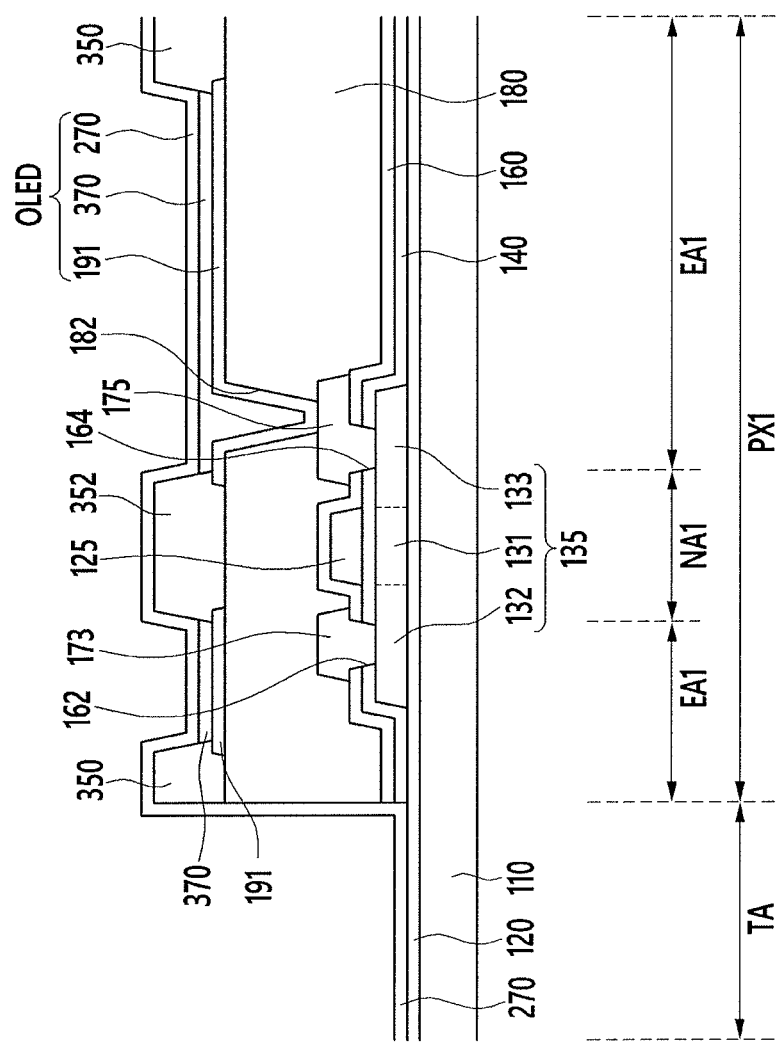
FIG. 17 illustrates a cross-sectional view of a display device according to an exemplary embodiment.

FIG. 17 illustrates a cross-sectional view of a display device according to an exemplary embodiment. As shown in FIG. 17, the display device according to the exemplary embodiment includes the substrate 110, the first electrode 191 on the substrate 110, the passivation layer 180 between the substrate 110 and the first electrode 191, the second electrode 270 on the first electrode 191, and the organic emission layer 370 between the first electrode 191 and the second electrode 270.

The substrate 110 includes the first pixel area PX1 and the transmissive area TA. The first pixel area PX1 includes the first emission area EA1 and the first non-emission area NA1.

In the previous exemplary embodiment, the thin film transistor is partially positioned within the first pixel area PX1, and is mostly positioned outside the first pixel area PX1. In the present exemplary embodiment, the thin film transistor is wholly positioned within the first pixel area PX1. That is, all of the semiconductor 135, the gate electrode 125, the source electrode 173, and the drain electrode 175 are positioned within the first pixel area PX1. Particularly, some of the thin film transistor may overlap the first non-emission area NA1 of the first pixel area PX1. The buried pattern 352 may be in the first non-emission area NA1 of the first pixel area PX1 and may overlap the thin film transistor along the first direction.

The passivation layer 180 is on the thin film transistor. A portion of the passivation layer 180 positioned on the thin film transistor is formed to be relatively thin compared to other portions thereof. When the passivation layer 180 is thin, the gas may be rapidly discharged in the baking process. In the present exemplary embodiment, since the thin film transistor is positioned within the first pixel area PX1, it is possible to thinly form a portion of the passivation layer 180 shielded by the first electrode 191. Accordingly, the gas remaining in the passivation layer 180 may be reduced, thus influence of the gas on the organic emission layer 370 may be reduced.

Although the first pixel area PX1 has been described, the present exemplary embodiment may be similarly applied to the second pixel area PX2 and the third pixel area PX3. That is, the thin film transistor may be positioned within the second pixel area PX2 and the third pixel area PX3.

A display device according to an exemplary embodiment will now be described with reference to FIG. 18. The display device according to the exemplary embodiment shown in FIG. 18 includes many portions that are the same as in the display device according to the exemplary embodiment shown in FIG. 17, which will not be described. In the present exemplary embodiment, a height from the substrate to the top surface of the passivation layer is not constant, which is different from the previous exemplary embodiment, and will now be described in detail.

Figure 18:
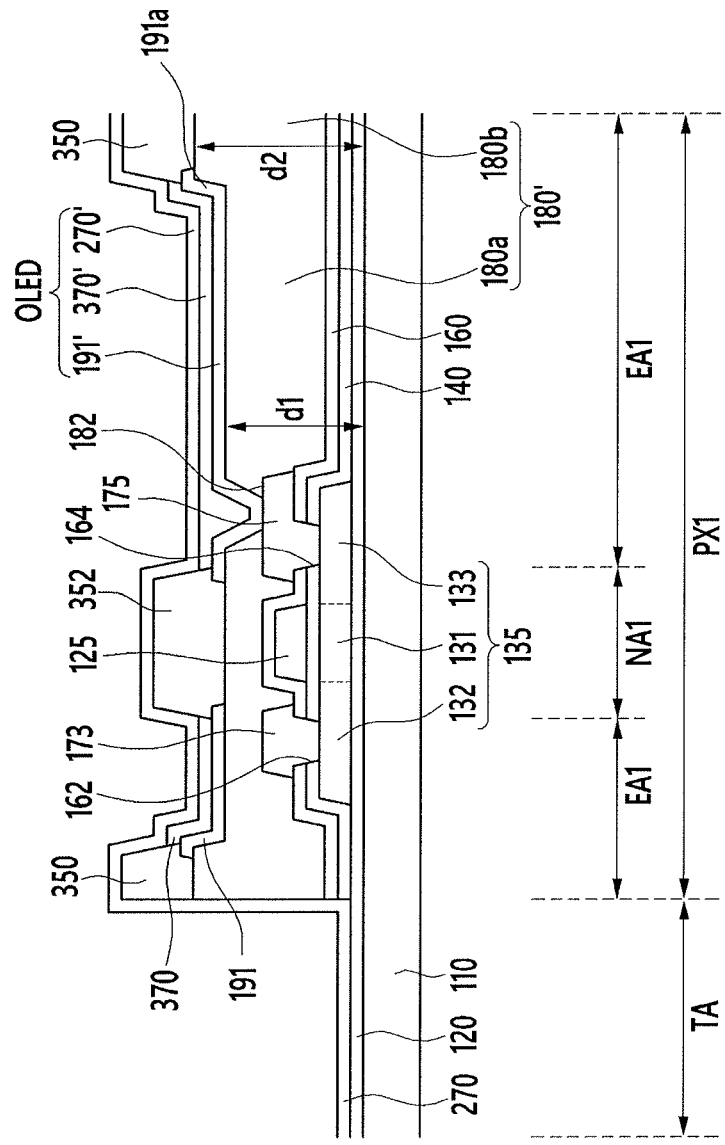
FIG. 18 illustrates a cross-sectional view of a display device according to an exemplary embodiment.

FIG. 18 illustrates a cross-sectional view of a display device according to an exemplary embodiment. As shown in FIG. 18, the display device according to the exemplary embodiment includes the substrate 110, a first electrode 191' on the substrate 110, the passivation layer 180 between the substrate 110 and the first electrode 191', a second electrode 270' on the first electrode 191', and an organic emission layer 370' between the first electrode 191' and the second electrode 270'.

The substrate 110 includes the first pixel area PX1 and the transmissive area TA. The first pixel area PX1 includes the first emission area EA1 and the first non-emission area NA1.

In the previous exemplary embodiment, the top surface of the passivation layer 180 is flat, and the distance from the substrate 110 to the top surface of the passivation layer 180 is constant. However, in the present exemplary embodiment, the top surface of the passivation layer 180' is not flat.

The passivation layer 180' includes a first portion 180a having a first height d1 and a second portion 180b having a second height d2. In this case, each of the first height d1 and the second height d2 means a distance from the substrate 110 to the top surface of the passivation layer 180'. The second height d2 is higher than the first height d1, i.e., a top surface thereof is further from the substrate 110. The first portion 180a is at the central portion of the first pixel area PX1, and the second portion 180b is at edges of the first pixel area PX1.

The first electrode 191' is on the passivation layer 180, and the first electrode 191 includes a step 191a between the first portion 180a and the second portion 180b of the passivation layer 180. In particular, the step 191 may extend along a side wall of the second portion 180b that protrudes from the first portion 180a in the first direction and may extend along a portion of the top surface of the second portion 180b along the second direction.

By thinly forming the passivation layer 180 at the central portion of the first pixel area PX1, time for discharging the gas during the baking process of the passivation layer 180' may be reduced. Accordingly, the organic emission layer 370 is less affected by the gas, thereby improving the emission characteristic.

By thickly forming the passivation layer 180' at the edge of the first pixel area PX1 so that the step 191a is provided at the first electrode 191', the distance the gas generated in the passivation layer 180 has to traverse to reach the organic emission layer 370 may be increased. That is, by allowing the step 191a of the first electrode 191' to serve as a barrier, gas may be prevented from reaching the organic emission layer 370'. Accordingly, the organic emission layer 370' is less affected by the gas, thereby improving the emission characteristic.

A display device according to an exemplary embodiment will now be described with reference to FIG. 19.

Figure 19:
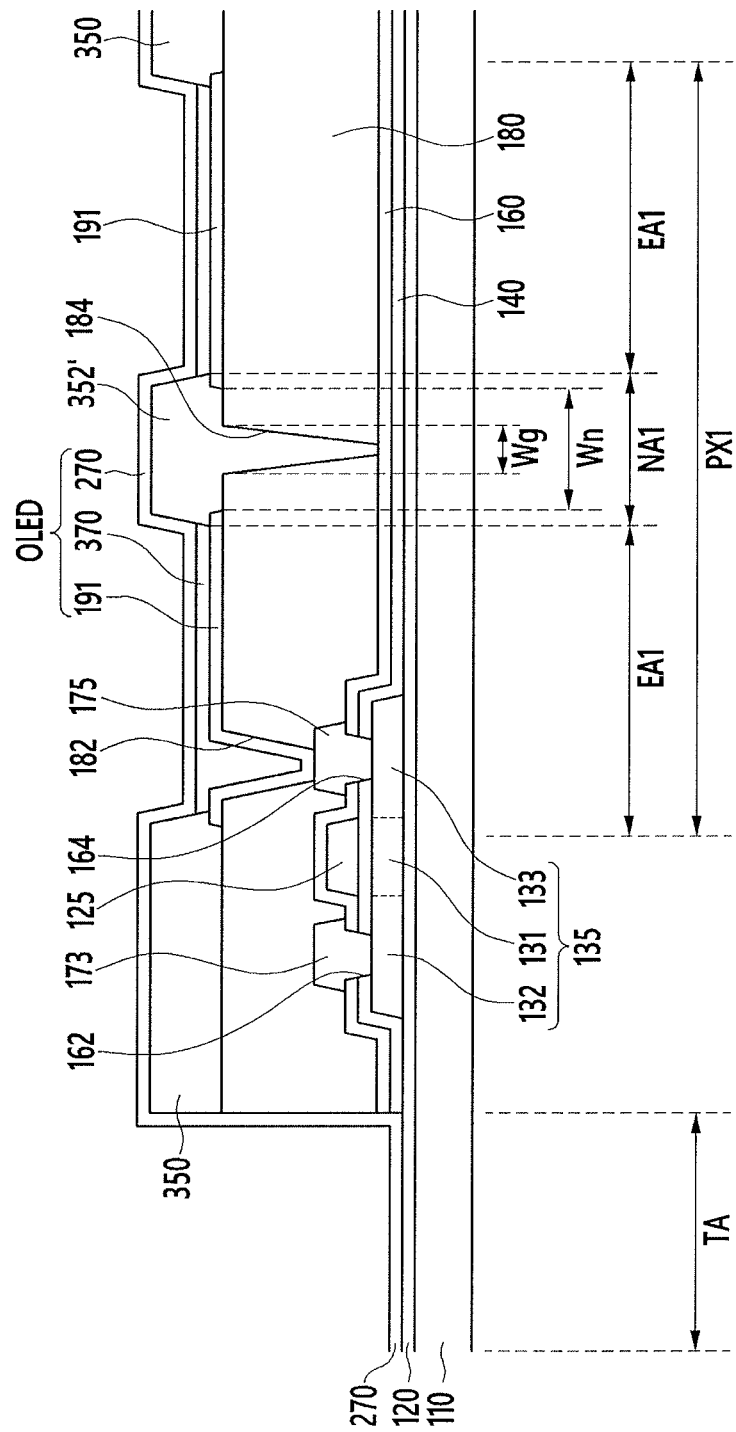
FIG. 19 illustrates a cross-sectional view of a display device according to an exemplary embodiment.

The display device according to the exemplary embodiment shown in FIG. 19 includes many portions that are the same as in the display device according to the exemplary embodiment shown in FIG. 1 to FIG. 5, which will not be described. In the present exemplary embodiment, a groove is formed in the passivation layer, which is different from the previous exemplary embodiment, and will now be described in detail.

FIG. 19 illustrates a cross-sectional view of a display device according to an exemplary embodiment. As shown in FIG. 19, the display device according to the exemplary embodiment includes the substrate 110, the first electrode 191 on the substrate 110, the passivation layer 180 between the substrate 110 and the first electrode 191, the second electrode 270 on the first electrode 191, and the organic emission layer 370 positioned between the first electrode 191 and the second electrode 270.

The substrate 110 includes the first pixel area PX1 and the transmissive area TA. The first pixel area PX1 includes the first emission area EA1 and the first non-emission area NA1.

In the present exemplary embodiment, a groove 184 is formed in the passivation layer 180. The gas generated during the baking process of the passivation layer 180 may be better discharged through a portion at which the groove 184 is formed, as the groove 185 increases a surface are through which the gas may be discharged.

The groove 184 may be in the first non-emission area NA1 of the first pixel area PX1. A buried pattern 352' may be in the first non-emission area NA1, and may also be positioned in the groove 184, e.g., may fill the groove 184.

A width Wg of the groove 184 may be narrower than that of the first non-emission area NA1. The first electrode 191 is not mostly in the first non-emission area NA1, i.e., only partially extends therein along the second direction, and is primarily in the first emission area EA1. Particularly, the width Wg of the groove 184 may be narrower than that of the portion at which the first electrode 191 does not exist in the first non-emission area NA1. In the first non-emission area NA1, when the width Wg of the groove 184 is wider than that of the portion Wn in which the first electrode 191 does not extend, the first electrode 191 may be formed in the groove 184. Since various electrode layers including the thin film transistor are provided below the passivation layer 180, when the first electrode 191 is formed in the groove 184, it may be short-circuited with the various electrode layers. In the present exemplary embodiment, by forming the width Wg of the groove 184 to be narrower than that of the portion Wn at which the first electrode 191 does not extend in the first non-emission area NA1, this problem may be addressed.

A display device according to an exemplary embodiment will now be described with reference to FIG. 20. The display device according to the exemplary embodiment shown in FIG. 20 includes many portions that are the same as in the display device according to the exemplary embodiment shown in FIG. 19, which will not be described. In the present exemplary embodiment, a groove is formed in an edge of the pixel area, which is different from the previous exemplary embodiment, and will now be described in detail.

Figure 20:
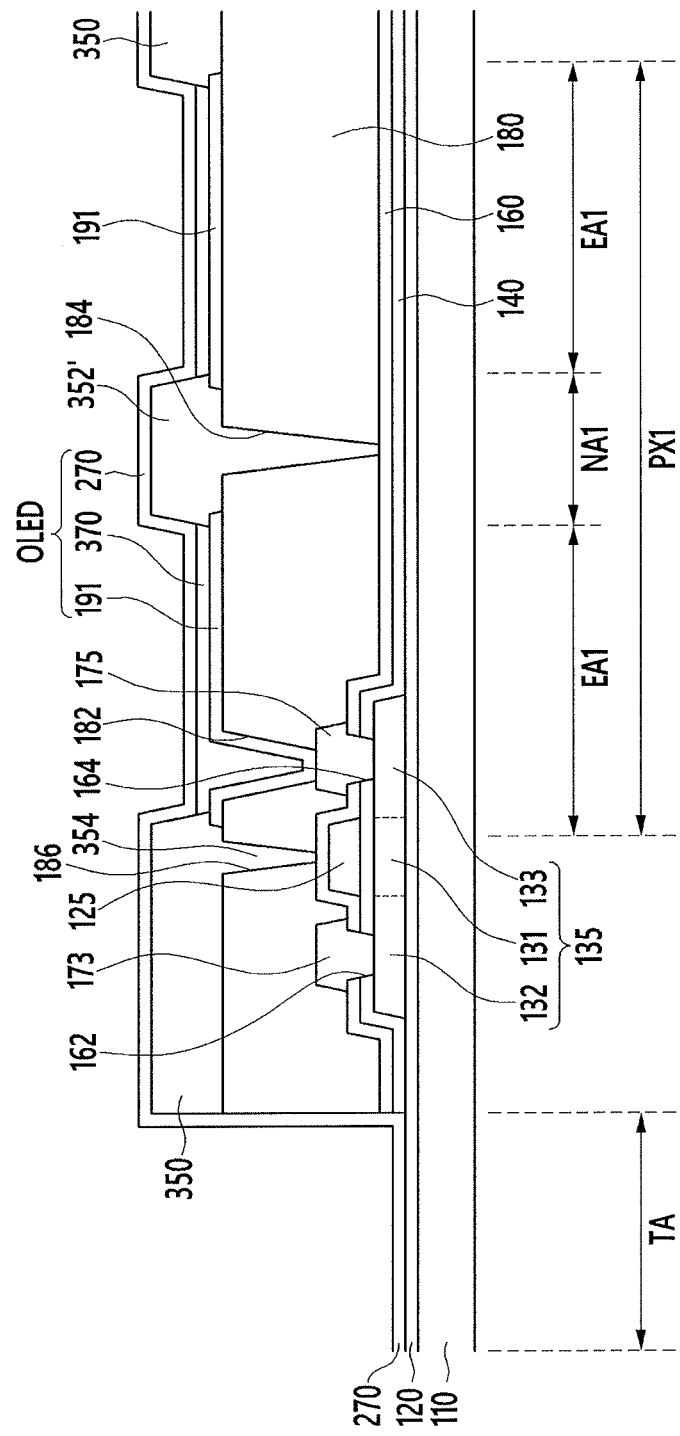
FIG. 20 illustrates a cross-sectional view of a display device according to an exemplary embodiment.

FIG. 20 illustrates a cross-sectional view of a display device according to an exemplary embodiment. As shown in FIG. 20, another groove 186 is provided in the passivation layer 180. The groove 186 is positioned to be adjacent to the edge of the first pixel area PX1, e.g., adjacent the semiconductor 135. The groove 186 may be positioned below the pixel defining layer 350. A buried pattern 354 may be provided in the groove 186 and may be integrated with the pixel defining layer 350. The buried pattern 354 and the pixel defining layer 350 may be formed under the same process, and with the same material.

Similar to the previous exemplary embodiment, the groove 184 may be further provided in the first non-emission area NA1 of the first pixel area PX1, and the buried pattern 352' may be in the groove 184.

Hereinafter, a display device according to an exemplary embodiment will be described with reference to FIG. 21. The display device according to the exemplary embodiment shown in FIG. 21 includes many portions that are the same as in the display device according to the exemplary embodiment shown in FIG. 1 to FIG. 5, which will not be described. In the present exemplary embodiment, a shape of the transmissive area is different from that of the previous exemplary embodiment, and will now be described in detail.

Figure 21:
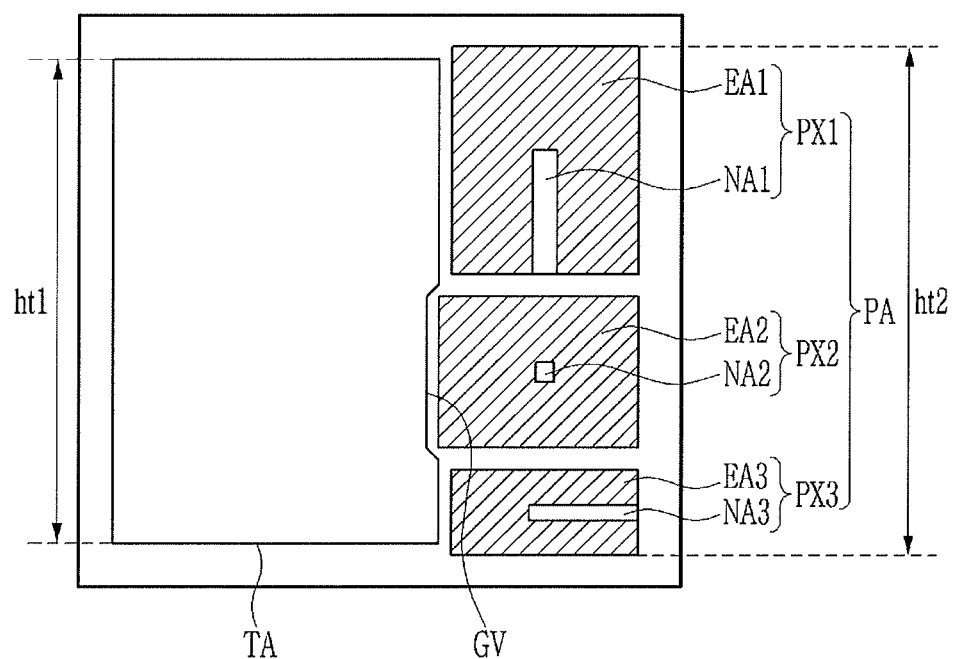
FIG. 21 illustrates a layout view of a display device according to an exemplary embodiment.

FIG. 21 illustrates a layout view of a display device according to an exemplary embodiment. As shown in FIG. 21, the display device according to the exemplary embodiment includes the pixel area PA and the transmissive area TA. The pixel area PA may include the first pixel area PX1, the second pixel area PX2, and the third pixel area PX3. The first pixel area PX1, the second pixel area PX2, and the third pixel area PX3 may display different colors, and may be formed to have different sizes. For example, the first pixel area PX1 may display a blue color, the second pixel area PX2 may display a green color, and the third pixel area PX3 may display a red color.

In the previous exemplary embodiment, the transmissive area TA is formed to have a rectangular shape in a plan view. In the present exemplary embodiment, the transmissive area TA is deformed to have a substantially rectangular shape in a plan view. In the present exemplary embodiment, the transmissive area TA may be increased, e.g., a width thereof may be increased, by decreasing a distance between the transmissive area TA and the pixel area PA. A groove GV may be provided at one edge of the transmissive area TA, e.g., adjacent the pixel area. As shown herein, the groove GV may be provided at a right edge of the transmissive area TA adjacent to the second pixel area PX2.

The second pixel area PX2 may be increased to compensate for the decrease in emission area due to the formation of the second non-emission area NA2. In this case, since it is difficult to deform an upper edge thereof adjacent to the first pixel area PX1 or a lower edge thereof adjacent to the third pixel area PX3, the second pixel area PX2 may be increased by extending a left edge thereof, e.g., from further towards the transmissive area TA than the first pixel area PX1 and the third pixel area PX3. Accordingly, a width of the second pixel area PX2 may be wider than that of the first pixel area PX1 and may be wider than that of the third pixel area PX3. In addition, the transmissive area TA may include the groove GV provided at a portion adjacent to the left edge of the second pixel area PX2, such that a width of the transmissive area TA adjacent to the second pixel area PX2 may be narrower than a width thereof adjacent to the first pixel area PX1 and the third pixel area PX3.

The first pixel area PX1 may be increased to compensate for the decrease in emission area due to the formation of the first non-emission area NA1. In this case, since it is difficult to deform a lower edge thereof adjacent to the second pixel area PX2 or a left edge thereof adjacent to the transmissive area TA, the first pixel area PX1 may be expanded by extending an upper edge thereof further upward, e.g., above an upper edge of the transmissive area TA. In a like manner, the third pixel area PX3 may be increased to compensate for the decrease in emission area due to the formation of the third non-emission area NA3. In this case, since it is difficult to deform an upper edge thereof adjacent to the second pixel area PX2 or a left edge thereof adjacent to the transmissive area TA, the third pixel area PX3 may be increased by extending a lower edge thereof further downward, e.g., below a lower edge of the transmissive area TA.

Edges of the pixel area PX and the first pixel area PX1 and the third pixel area PX3 may overlap various wires without affecting the light emission. Thus, it is possible to increase the pixel area PA as described above. However, when the transmissive area TA overlaps wires, since it affects transmittance, it is not easy to expand the transmissive area TA. Accordingly, a length ht1 from the upper edge to the lower edge of the transmissive area TA may be shorter than a length ht2 from the upper edge to the lower edge of the pixel area PX.

The shapes of the first non-emission area NA1, the second non-emission area NA2, and the third non-emission area NA3 of FIG. 21 are illustrated to be similar to those of the first non-emission area NA1, the second non-emission area NA2, and the third non-emission area NA3 of FIG. 1, but the present exemplary embodiment is not limited thereto. The shapes of the first non-emission area NA1, the second non-emission area NA2, and the third non-emission area NA3 of FIG. 21 may be similar to those of the first non-emission area NA1, the second non-emission area NA2, and the third non-emission area NA3 of at least one of FIG. 10, FIG. 14, FIG. 15, and FIG. 16, and otherwise increased as describe above.

In addition, the shapes of the transmissive area TA, the first pixel area PX1, the second pixel area PX2, and the third pixel area PX3 may be variously modified.

Hereinafter, a display device according to an exemplary embodiment will be described with reference to FIG. 22. The display device according to the exemplary embodiment shown in FIG. 22 includes many portions that are the same as in the display device according to the exemplary embodiment shown in FIG. 21, which will not be described. In the present exemplary embodiment, a shape of the transmissive area is different from that of the previous exemplary embodiment, and will now be described in detail.

Figure 22:
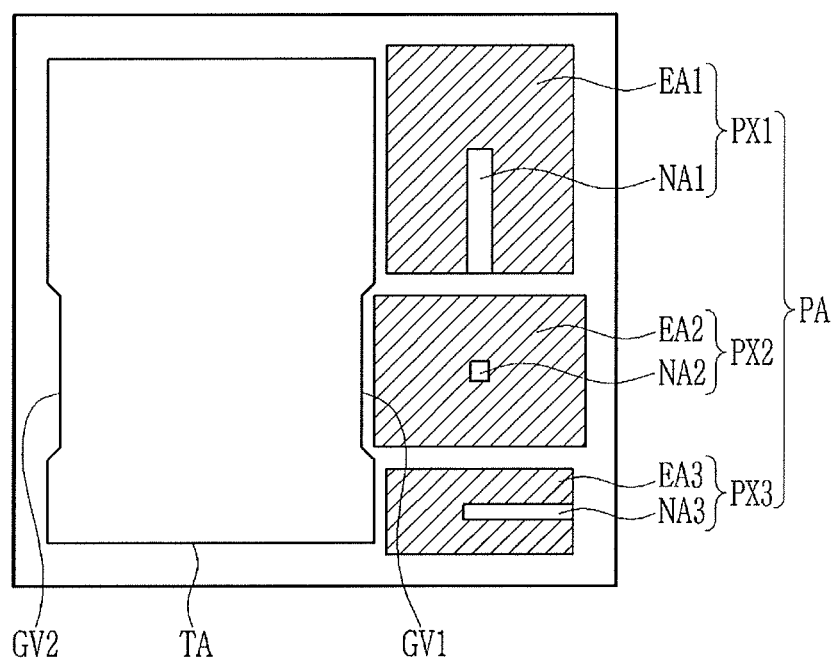
FIG. 22 illustrates a layout view of a display device according to an exemplary embodiment.

FIG. 22 illustrates a layout view of a display device according to an exemplary embodiment. As shown in FIG. 22, the display device according to the exemplary embodiment includes the pixel area PA and the transmissive area TA.

Similar to the previous exemplary embodiment, the transmissive area TA is deformed to have a substantially rectangular shape in a plan view, and a width of the transmissive area TA adjacent to the second pixel area PX2 may be narrower than a width thereof adjacent to the first pixel area PX1 and the third pixel area PX3.

In the previous exemplary embodiment, the groove GV (FIG. 21) is provided at only one edge of the transmissive area TA, while in the present exemplary embodiment, a first groove GV1 and a second groove GV2 are respectively provided at opposite edges of the transmissive area TA. The first groove GV1 is provided at a right edge of the transmissive area TA adjacent to the second pixel area PX2, and the second groove GV2, which is positioned at an opposite side of the first groove GV1, is provided at a left edge of the transmissive area TA. The first groove GV1 and the second groove GV2 may be symmetrical.

In the previous exemplary embodiment, the second pixel area PX2 is increased by extending a left edge thereof, while in the present exemplary embodiment, the second pixel area PX2 is increased by extending the left edge and a right edge thereof.

Although not illustrated, the display device according to the exemplary embodiment may include a plurality of transmissive areas and a plurality of pixel areas. Another pixel area may be positioned at a left side of the transmissive area TA shown in FIG. 22, and the second groove GV2 may be provided at the second pixel area adjacent to a left side of the transmissive area TA.

Hereinafter, a display device according to an exemplary embodiment will be described with reference to FIG. 23. The display device according to the exemplary embodiment shown in FIG. 23 includes many portions that are the same as in the display device according to the exemplary embodiment shown in FIG. 21, which will not be described. In the present exemplary embodiment, shapes of the transmissive area and the first pixel area are different from those of the previous exemplary embodiment, and will now be described in detail.

Figure 23:
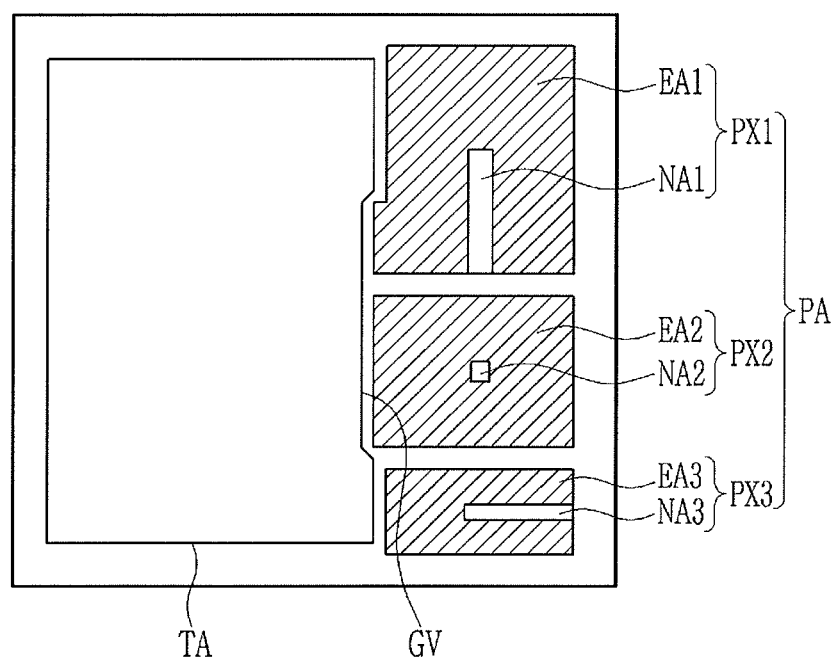
FIG. 23 illustrates a layout view of a display device according to an exemplary embodiment.

FIG. 23 illustrates a layout view of a display device according to an exemplary embodiment. Similar to the previous exemplary embodiment, the transmissive area TA is deformed to have a substantially rectangular shape in a plan view, and a width of the transmissive area TA adjacent to the second pixel area PX2 may be narrower than a width thereof adjacent to the third pixel area PX3.

In the present exemplary embodiment, a width of some of the transmissive area TA adjacent to the first pixel area PX1 may be narrower than a width thereof adjacent to the third pixel area PX3, e.g., a groove GV may extend adjacent an entirety of the second pixel area PX2 and a portion of the first pixel area PX1.

In the present exemplary embodiment, the first pixel area PX1 is increased by extending some of a lower portion of a left edge thereof. Accordingly, the width of the transmissive area TA adjacent to some of the lower portion of the first pixel area PX1 and to the second pixel area PX2 may be narrower than those of other portions.

Hereinafter, a display device according to an exemplary embodiment will be described with reference to FIG. 24. The display device according to the exemplary embodiment shown in FIG. 24 includes many portions that are the same as in the display device according to the exemplary embodiment shown in FIG. 23, which will not be described. In the present exemplary embodiment, a shape of the transmissive area is different from those of the previous exemplary embodiment, and will now be described in detail.

Figure 24:
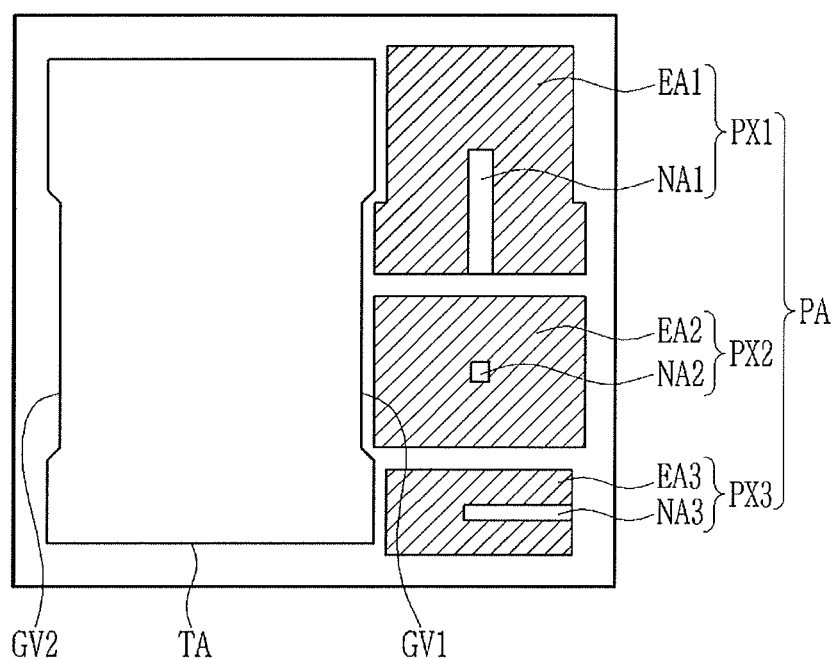
FIG. 24 illustrates a layout view of a display device according to an exemplary embodiment.

FIG. 24 illustrates a layout view of a display device according to an exemplary embodiment. Similar to the previous exemplary embodiment, the transmissive area TA is deformed to have a substantially rectangular shape in a plan view, and a width of the transmissive area TA adjacent to some of the first pixel area PX1 and to the second pixel area PX2 may be narrower than a width thereof adjacent to the third pixel area PX3.

In the previous exemplary embodiment, the groove GV (FIG. 23) is provided at only one edge of the transmissive area TA, while in the present exemplary embodiment, the first groove GV1 and the second groove GV2 are respectively provided at opposite edges of the transmissive area TA. The first groove GV1 is provided at a right edge of the transmissive area TA adjacent to the first pixel area PX1 and the second pixel area PX2, and the second groove GV2 is provided at a left edge of the transmissive area TA adjacent to the first pixel area PX1 and the second pixel area PX2. The first groove GV1 and the second groove GV2 may be symmetrical.

In the present exemplary embodiment, the first pixel area PX1 is increased by extending a portion of the left and right edges thereof.

By way of summation and review, when a passivation layer made of organic material is between the transistors and the electrodes, gas may be generated therein while the organic material is being baked. Although the generated gas moves to a top surface of the passivation layer, it is blocked by an electrode on the passivation layer, such that the gas may not be discharged. The organic emission layer is vulnerable to moisture permeation and may be affected by the gas generated from the passivation layer, thereby deteriorating emission characteristics thereof.

In contrast, in accordance with one or more embodiments, by forming the non-emission area in which most of electrode is not positioned in the first pixel area, i.e., the passivation layer is exposed by the electrode, gas remaining in the passivation layer may be sufficiently discharged through the non-emission area. Further, by setting the distance from all of the edges of the pixel area to the non-emission area to be equal to or less than about 50 μm, the electrode in the emission area may not continuously shield the passivation layer, allowing the gas to escape therefrom. Accordingly, deterioration of the emission characteristic of the organic emission layer may be reduced or prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
 a substrate having a first pixel area, a second pixel area, and a third pixel area that each emit a different color from each other with each pixel area including:
 a first electrode on the substrate, including an opening that is surrounded by the first electrode;
 a passivation layer between the substrate and the first electrode;
 a second electrode on the first electrode; and
 an organic emission layer between the first electrode and the second electrode.

2. The display device as claimed in claim 1, wherein:
 each of the first pixel area, the second pixel area, and the third pixel area includes an emission area and a non-emission area surrounded by the emission area,
 the first electrode and the organic emission layer are in the emission area, and
 the opening is in the non-emission area.

3. The display device as claimed in claim 2, wherein the first pixel area, the second pixel area, the third pixel area, and the non-emission areas are substantially quadrangular.

4. The display device as claimed in claim 2, wherein the non-emission area of at least one of the first pixel area, the second pixel area, and the third pixel area has a cross shape in a plan view.

5. The display device as claimed in claim 2, wherein:
the first pixel area displays a blue color, the second pixel area displays a green color, and the third pixel area displays a red color,
the first pixel area is larger than the second pixel area, and the second pixel area is larger than the third pixel area.

6. The display device as claimed in claim 5, wherein:
the non-emission area of the first pixel area has a cross shape in a plan view,
the non-emission area of the second pixel area has a quadrangular shape in a plan view, and
the non-emission area of the third pixel area has a quadrangular shape in a plan view.

7. The display device as claimed in claim 2, wherein a portion of the emission area disposed at one side of the non-emission area and a portion of the emission area disposed at an opposite side of the non-emission area are substantially symmetrical.

8. The display device as claimed in claim 2, wherein:
the substrate further includes a transmissive area adjacent to the first pixel area, the second pixel area, and the third pixel area,
the second pixel area is between the first pixel area and the third pixel area, and
a first length from an upper edge of the first pixel area to a lower edge of the third pixel area is longer than a second length from an upper edge to a lower edge of the transmissive area.

9. The display device as claimed in claim 2, wherein each of the first pixel area, the second pixel area, and the third pixel area further comprises:
a buried pattern in the non-emission area; and
a pixel defining layer that surrounds an edge of the first pixel area, the second pixel area, and the third pixel area, wherein the buried pattern overlaps the opening and an edge of the first electrode, wherein
a first height from the substrate to a top surface of the buried pattern is lower than a second height from the substrate to a top surface of the pixel defining layer.

10. The display device as claimed in claim 9, wherein a width of the buried pattern is larger than a width of the opening.

11. The display device as claimed in claim 1, wherein the first electrode is a unitary electrically-conductive body.

12. The display device as claimed in claim 11, wherein the opening of at least one pixel area is completely enclosed by its respective first electrode in plan view.

13. The display device as claimed in claim 11, wherein the opening of each pixel area is completely enclosed by its respective first electrode in plan view.

14. A display device, comprising:
a substrate having a first pixel area, a second pixel area, and a third pixel area that each emit a different color from each other with each pixel area including:
a first electrode on the substrate that includes multiple unitary electrically-conductive bodies that are in direct electrical contact with one another and an opening that is surrounded by the multiple unitary electrically-conductive bodies;
a passivation layer between the substrate and the first electrode;
a second electrode on the first electrode; and
an organic emission layer between the first electrode and the second electrode.

15. The display device as claimed in claim 14, wherein the multiple unitary electrically-conductive bodies are in direct electrical contact with a common transistor drain electrode through different contact holes.

* * * * *